US009620691B2

(12) United States Patent
Oh et al.

(10) Patent No.: US 9,620,691 B2
(45) Date of Patent: Apr. 11, 2017

(54) LIGHT EMITTING DEVICE PACKAGE

(71) Applicant: LG INNOTEK CO., LTD., Seoul (KR)

(72) Inventors: Sung Joo Oh, Seoul (KR); Keal Doo Moon, Seoul (KR); Gyu Hyeong Bak, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/833,631

(22) Filed: Aug. 24, 2015

(65) Prior Publication Data
US 2016/0056356 A1 Feb. 25, 2016

(30) Foreign Application Priority Data

Aug. 22, 2014 (KR) .......................... 10-2014-0109577
Nov. 13, 2014 (KR) .......................... 10-2014-0157996

(51) Int. Cl.
*H01L 33/00* (2010.01)
*H01L 33/62* (2010.01)
(Continued)

(52) U.S. Cl.
CPC .............. *H01L 33/62* (2013.01); *H01L 33/60* (2013.01); *H01L 33/647* (2013.01);
(Continued)

(58) Field of Classification Search
CPC ................................. H01L 33/60; H01L 33/62
See application file for complete search history.

(56) References Cited

U.S. PATENT DOCUMENTS

2003/0178691 A1* 9/2003 Wang .................... H01L 33/486
257/431
2012/0313131 A1* 12/2012 Oda .................. H01L 23/49503
257/98
(Continued)

FOREIGN PATENT DOCUMENTS

EP          1 258 929 A2    11/2002
JP       2010-118528 A       5/2010
(Continued)

OTHER PUBLICATIONS

European Search Report dated Nov. 18, 2015 issued in Application No. 15181727.7.

*Primary Examiner* — William Harriston
(74) *Attorney, Agent, or Firm* — KED & Associates, LLP

(57) ABSTRACT

Embodiments provide a light emitting device package including a first lead frame including a first contact area and a first exposed area, a second lead frame spaced apart from the first lead frame, the second lead frame including a second contact area and a second exposed area, a bottom portion located between the first contact area and the first exposed area, between the second contact area and the second exposed area, and between the first contact area and the second contact area, a light emitting device electrically connected to the first and second contact areas, and a package body having a cavity configured to expose the first and second contact areas, the first and second exposed areas, and the bottom portion, wherein the bottom portion has a thermal expansion coefficient greater than a thermal expansion coefficient of the first and second lead frames.

15 Claims, 15 Drawing Sheets

(51) Int. Cl.
*H01L 33/60* (2010.01)
*H01L 33/64* (2010.01)

(52) U.S. Cl.
CPC ............ *H01L 2224/16245* (2013.01); *H01L 2224/32245* (2013.01); *H01L 2224/48091* (2013.01); *H01L 2224/48247* (2013.01); *H01L 2224/48257* (2013.01); *H01L 2224/49107* (2013.01); *H01L 2224/73204* (2013.01); *H01L 2224/73265* (2013.01); *H01L 2924/181* (2013.01)

(56) References Cited

U.S. PATENT DOCUMENTS

| | | | |
|---|---|---|---|
| 2013/0087825 A1* | 4/2013 | Umakoshi | H01L 33/60 257/99 |
| 2013/0121000 A1* | 5/2013 | Lee | H01L 33/60 362/293 |
| 2013/0181236 A1 | 7/2013 | Tamaki et al. | |
| 2013/0343067 A1 | 12/2013 | Okada | |

FOREIGN PATENT DOCUMENTS

| | | |
|---|---|---|
| KR | 10-2010-0106933 A | 10/2010 |
| KR | 10-2013-0103135 A | 9/2013 |
| KR | 10-1316009 B1 | 10/2013 |

\* cited by examiner

LIGHT EMITTING DEVICE PACKAGE

CROSS REFERENCE TO RELATED APPLICATION

This application claims priority under 35 U.S.C. §119 to Korean Patent Application No. 10-2014-0109577 filed in Korea on Aug. 22, 2014 and 10-2014-0157996, filed in Korea on Nov. 13, 2014, which is hereby incorporated in its entirety by reference as if fully set forth herein.

BACKGROUND

1. Field

Embodiments relate to a light emitting device package.

2. Background

Light emitting devices, such as light emitting diodes or laser diodes, which use group III-V or II-VI compound semiconductors, are capable of emitting visible and ultraviolet light of various colors such as red, green, and blue owing to development of device materials and thin film growth techniques. These light emitting devices are also capable of emitting white light with high luminous efficacy through use of a fluorescent substance or color combination and have several advantages of low power consumption, semi-permanent lifespan, fast response speed, safety, and environmental friendliness as compared to conventional light sources such as, for example, fluorescent lamps and incandescent lamps.

Accordingly, application sectors of the light emitting devices are expanded up to transmission modules of optical communication means, light emitting diode backlights to replace Cold Cathode Fluorescence Lamps (CCFLs) which serve as backlights of Liquid Crystal Display (LCD) apparatuses, white light emitting diode lighting apparatus to replace fluorescent lamps or incandescent lamps, vehicle headlamps, and traffic lights.

A light emitting device package is widely used in a lighting apparatus or a display apparatus. The light emitting device package may generally include a body, lead frames located within the body, and a light emitting device (e.g., an LED) disposed on any one of the lead frames.

BRIEF DESCRIPTION OF THE DRAWINGS

The embodiments will be described in detail with reference to the following drawings in which like reference numerals refer to like elements wherein.

DETAILED DESCRIPTION

Figure 1:
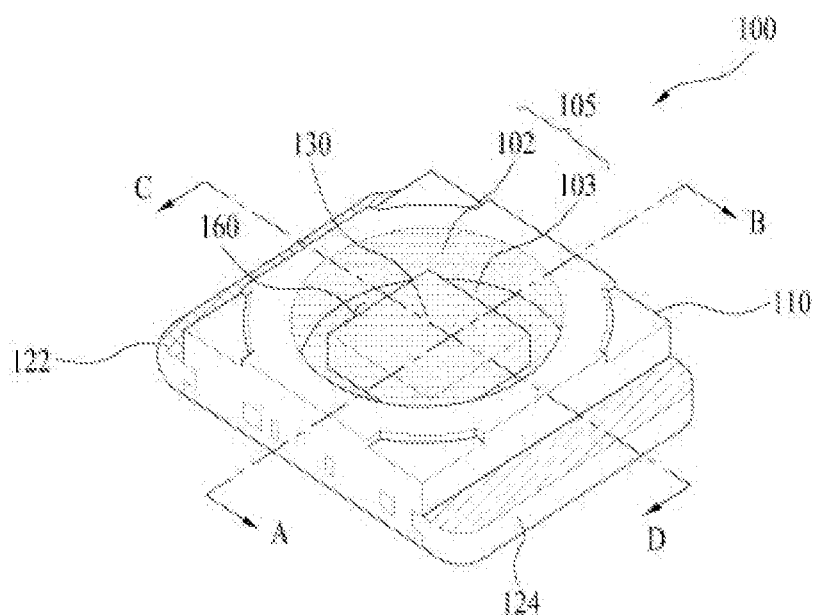
FIG. 1 is a perspective view illustrating a light emitting device package according to an embodiment.
Figure 2:
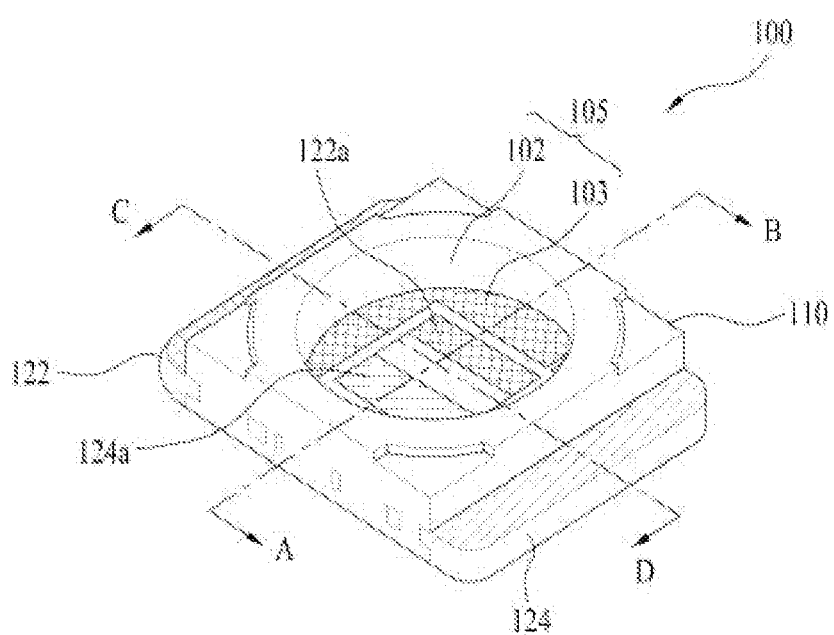
FIG. 2 is a perspective view illustrating the light emitting device package, from which a light emitting device and a resin layer are omitted, compared to FIG. 1.
Figure 3:
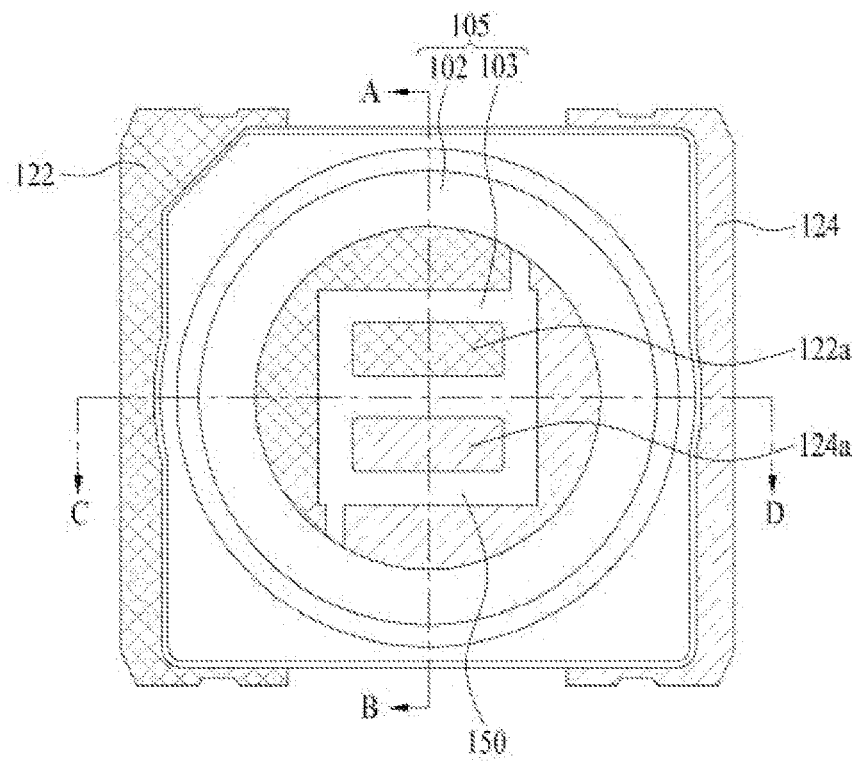
FIG. 3 is a plan view of the light emitting device package illustrated in FIG. 2.
Figure 4:
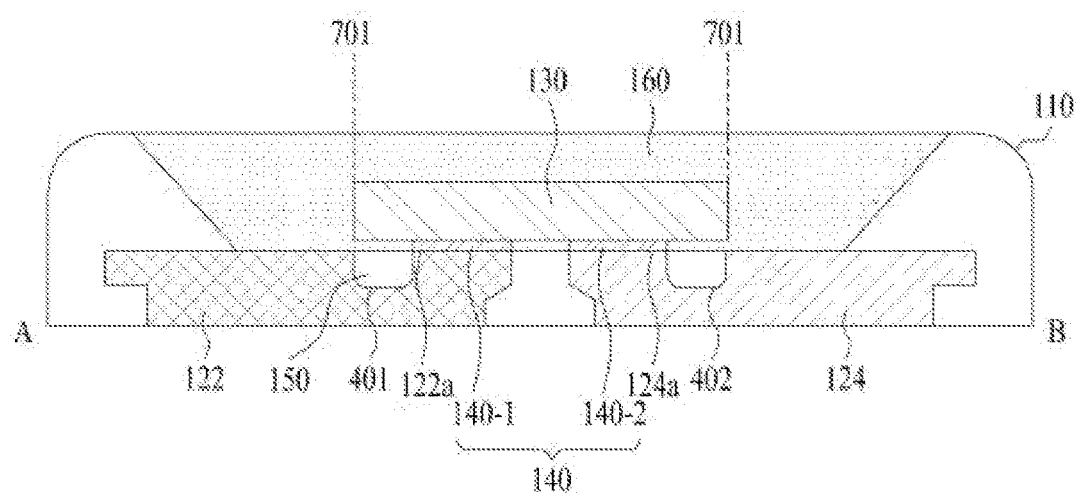
FIG. 4 is a sectional view of the light emitting device package illustrated in FIG. 1 taken along the direction AB.
Figure 5:
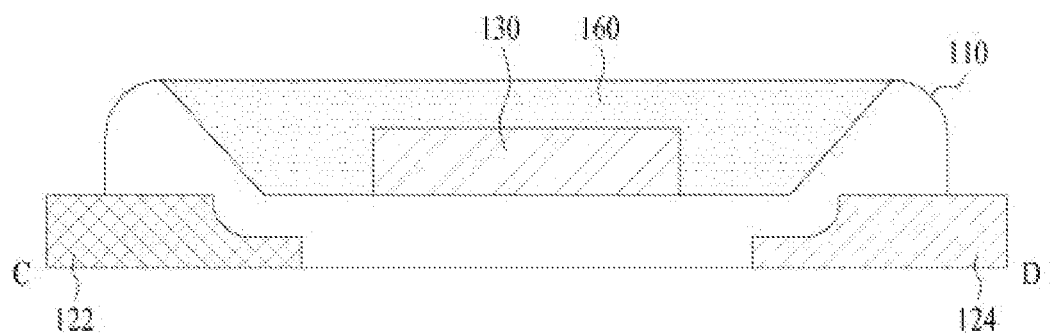
FIG. 5 is a sectional view of the light emitting device package illustrated in FIG. 1 taken along the direction CD.

FIG. 1 is a perspective view illustrating a light emitting device package 100 according to an embodiment, FIG. 2 is a perspective view illustrating the light emitting device package, from which a light emitting device 130 and a resin layer 160 are omitted, compared to FIG. 1, FIG. 3 is a plan view of the light emitting device package 100 illustrated in FIG. 2, FIG. 4 is a sectional view of the light emitting device package 100 illustrated in FIG. 1 taken along the direction AB, and FIG. 5 is a sectional view of the light emitting device package 100 illustrated in FIG. 1 taken along the direction CD.

Referring to FIGS. 1 to 5, the light emitting device package 100 includes a package body 110, first and second lead frames 122 and 124, a light emitting device 130, an adhesive member 140, a bottom portion 150, and a resin layer 160.

The package body 110 may be formed as a board having good electric insulation or thermal conductivity such as, for example, a silicon-based wafer level package, a silicon board, a silicon carbide (SiC) board, or an aluminum nitride (AlN) board, and may take the form of a stack comprised of a plurality of boards.

Alternatively, the package body 110 may be formed of a resin material such as, for example, polyphthalamide (PPA), an EMC resin, or a PCT resin, without being limited thereto. In addition, the embodiment is not limited to the material, structure, and shape of the body described above.

The package body 110 may have a cavity 105 defined by a side surface 102 and a bottom 103. The side surface 102 of the cavity may be inclined relative to the bottom 103 of the cavity 105. The bottom 103 of the cavity 105 may include contact areas 122a and 124a, the bottom portion 150, and exposed areas 122b and 124b, which will be described below.

The first lead frame 122 and the second lead frame 124 may be spaced apart from each other on the surface of the package body 110 so as to be electrically isolated from each other in consideration of heat dissipation or the arrangement of the light emitting device 130. The first lead frame 122 and the second lead frame 124 may be formed of at least one selected from among titanium (Ti), copper (Cu), nickel (Ni), gold (Au), chrome (Cr), tantalum (Ta), platinum (Pt), tin (Sn), silver (Ag), and phosphorus (P), or may be formed of any of alloys including at least one of the aforementioned materials. The first lead frame 122 and the second lead frame 124 may have a single layer or multi-layer structure.

A reflective member may be coated on the surfaces of the first and second lead frames 122 and 124 to reflect light emitted from the light emitting device 130. For example, the reflective member may be formed of Ag, without being limited thereto.

At least a part of each of the first and second lead frames 122 and 124 may be exposed through the cavity 105 of the package body 110. For example, the lower surface of each of the first and second lead frames 122 and 124 may be exposed through the lower surface of the package body 110. In addition, one end of each of the first and second lead frames 122 and 124 may be exposed through the side surface of the package body 110.

In addition, part of the upper surface of each of the first and second lead frames 122 and 124 may be exposed through the bottom 103 of the cavity 105 of the package body 110. The upper surface of the first lead frame 122 may include the first contact area 122*a* and the first exposed area 122*b*, and the upper surface of the second lead frame 124 may include the second contact area 122*b* and the second exposed area 124*b*.

Figure 6:
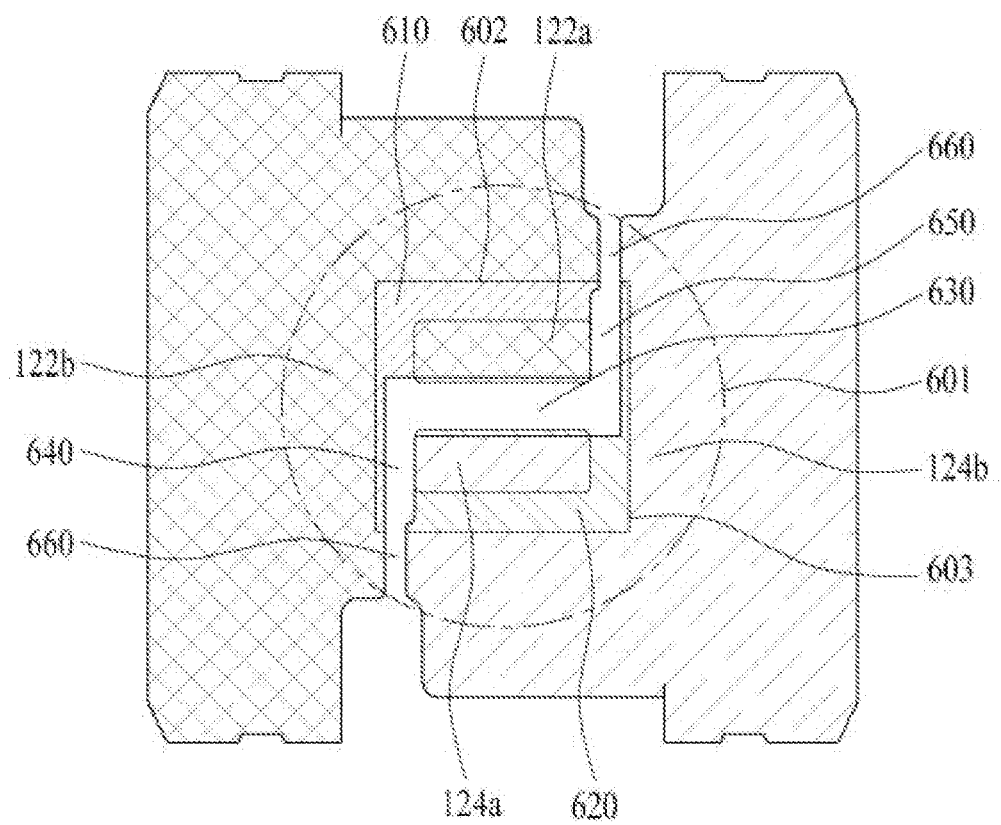
FIG. 6 is a plan view illustrating first and second lead frames 122 and 124 illustrated in FIG. 3.
Figure 7:
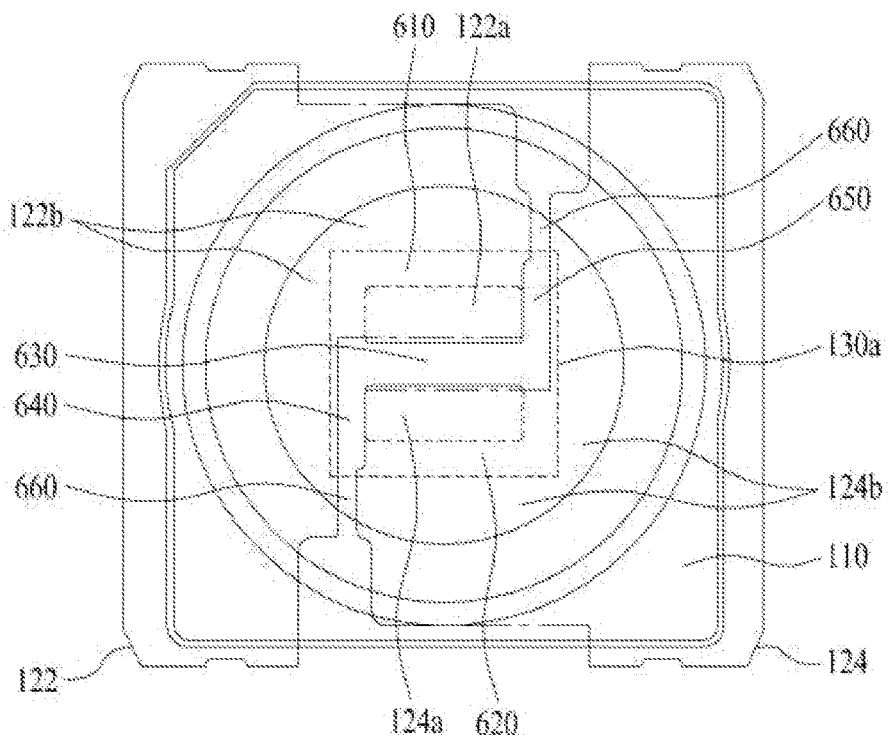
FIG. 7 is a plan view illustrating the first and second lead frames illustrated in FIG. 6 and a package body illustrated in FIG. 3 in conjunction with each other.

FIG. 6 is a plan view illustrating the first and second lead frames 122 and 124 illustrated in FIG. 3, and FIG. 7 is a plan view illustrating the first and second lead frames 122 and 124 illustrated in FIG. 6 and the package body 110 illustrated in FIG. 3 in conjunction with each other.

In FIG. 6, a dotted line 601 corresponds to the lower end of the cavity 105 of the package body 110. The inside of the dotted line 601 shows the upper surfaces of the first and second lead frames 122 and 124 exposed through the cavity 105 and the bottom portion 150. A first solid line 602 represents the boundary line between the bottom portion 150 and the first exposed area 122*b*, and a second solid line 603 represents the boundary line between the bottom portion 150 and the second exposed area 124*b*.

Represent areas of the first and second lead frames 122 and 124 corresponding to the edge of the light emitting device 130. In addition, a dotted line 130*a* illustrated in FIG. 7 represents the contour line of the light emitting device 130.

Referring to FIGS. 3, 6, and 7, one end of the first lead frame 122 includes a first convex portion and a first concave portion, and the second lead frame 124 includes a second convex portion facing the first concave portion and a second concave portion facing the first convex portion.

For example, one end of the first convex portion of the first lead frame 122 may be located to correspond to the second concave portion of the second lead frame 124, one end of the second convex portion of the second lead frame 124 may be located to correspond to the first concave portion of the first lead frame 122, and one side of the first convex portion of the first lead frame 122 may be located to face one side of the second convex portion of the second lead frame 124.

A first space between the first convex portion of the first lead frame 122 and the second concave portion of the second lead frame 124, a second space between one side of the first convex portion of the first lead frame 122 and one side of the second convex portion of the second lead frame 124, and a third space between one end of the second convex portion of the second lead frame 124 and the first concave portion of the first lead frame 122 may be spaces to electrically isolate the first lead frame 122 and the second lead frame 124 to each other.

Portions between the first space and the second space and between the second space and the third space may have a bent shape. For example, the angles between the first space and the second space and between the second space and the third space may be right angles, without being limited thereto.

The first contact area 122*a* may be located on one side of the first convex portion of the first lead frame 122, and the second contact area 124*a* may be located on one side of the second convex portion of the second lead frame 124.

The upper surface of the first lead frame 122 may include the first contact area 122*a* and the first exposed area 122*b* which is connected to the first contact area 122*a*. The first contact area 122*a* and the first exposed area 122*b* may be exposed from the cavity 105.

In addition, the upper surface of the second lead frame 124 may include the second contact area 124*a* and the second exposed area 124*b* which is connected to the second contact area 124*a*. The second contact area 124*a* and the second exposed area 124*b* may be exposed from the cavity 105.

The first contact area 122*a* and the second contact area 124*a* may be electrically connected to the light emitting device 130 which will be described below. For example, the light emitting device 130 may include a first electrode (e.g., an n-type electrode) and a second electrode (e.g., a p-type electrode). The first electrode of the light emitting device 130 may be bonded to the first contact area 122*a*, and the second electrode of the light emitting device 130 may be bonded to the second contact area 124*a*.

The bottom portion 150 may be located between the first contact area 122*a* and the first exposed area 122*b* of the first lead frame 122, between the second contact area 124*a* and the second exposed area 124*b* of the second lead frame 124, and between the first contact area 122*a* of the first lead frame 122 and the second contact area 124*a* of the second lead frame 124.

The bottom portion 150 may also be located between the first lead frame 122 and the second contact area 124*a* and between the second lead frame 124 and the first contact area 122*a*. The bottom portion 150 may also be located between the first exposed area 122*b* and the second exposed area 124*b* which are arranged to face each other.

For example, the bottom portion 150 may include a first attenuation portion 610 located between the first contact area 122*a* and the first exposed area 122*b*, a second attenuation portion 620 located between the second contact area 124*a* and the second exposed area 124*b*, a third attenuation portion 630 located the first contact area 122*a* and the second contact area 124*a*, a fourth attenuation portion 640 located the first lead frame 122 and the second contact area 124*a*, a fifth attenuation portion 650 located between the second lead frame 124 and the first contact area 122*a*, and a sixth attenuation portion 660 located the first exposed area 122*b* and the second exposed area 124*b*.

The reflectance of the bottom portion 150 may be higher than the reflectance of the upper surfaces of the first and second lead frames 122 and 124. For example, the light reflectance of the bottom portion 150 may be higher than the light reflectance of the first and second contact areas 122*a* and 124*a* and the light reflectance of the first and second exposed areas 122*b* and 124*b*.

The bottom portion 150 electrically isolates the first lead frame 122 and the second lead frame 124 from each other.

For example, the third to sixth attenuation portions 630 may electrically isolate the first lead frame 122 and the second lead frame 124 from each other.

The first lead frame 122 may have a first groove (401, see FIG. 4) located between the first contact area 122a and the first exposed area 122b, and the second lead frame 124 may have a second groove (404, see FIG. 4) located between the second contact area 124a and the second exposed area 124b. Part of the bottom portion 150 may be located in the first and second grooves 401 and 402.

For example, the first attenuation portion 610 may be located in the first groove 401, and the second attenuation portion 620 may be located in the second groove 402. The lower surface of the first groove 401 may be spaced apart from the lower surface of the first lead frame 122, and the lower surface of the second groove 402 may be spaced apart from the lower surface of the second lead frame 124.

The thermal expansion coefficient of the bottom portion 150 may be greater than the thermal expansion coefficient of the light emitting device 130 and the thermal expansion coefficient of the first and second lead frames 122 and 124 or the adhesive member 140.

For example, the thermal expansion coefficient of the light emitting device 130 formed of GaN may be 5.59, the thermal expansion coefficient of the first and second lead frames 122 and 124 formed of Cu may be 16.5, and the thermal expansion coefficient of the adhesive member 140 may be 22.

In addition, the thermal expansion coefficient of the bottom portion 150 may be greater than the thermal expansion coefficient of the first and second lead frames 122 and 124 and may be equal to or smaller than the thermal expansion coefficient of the package body 110.

For example, the bottom portion 150 may be formed of the same material as the package body 110 and may be integrated with the package body 110, without being limited thereto. In another embodiment, the bottom portion 150 may be formed of a separate material, which has the thermal expansion coefficient smaller than the thermal expansion coefficient of the package body 110.

For example, the thermal expansion coefficient of the package body 110, formed of an EMC resin, may be 33, and the thermal expansion coefficient of the bottom portion 150 may be equal to or smaller than the thermal expansion coefficient of the EMC resin.

The surface area of the bottom portion 150, exposed through the cavity 105, may be smaller than the sum of the surface areas of the first and second contact areas 122a and 124a exposed through the cavity 105 and the surface areas of the first and second exposed areas 122b and 124b.

Referring to FIGS. 6 and 7, the edge of the light emitting device 130 may be aligned with a first boundary line 701 in the vertical direction. Here, the vertical direction may be the direction perpendicular to the upper surfaces of the first and second lead frames 122 and 124, and the edge of the light emitting device 130 may be the side surface of the light emitting device 130.

The first boundary line 701 may be comprised of the boundary line 602 between the bottom portion 150 and the first exposed area 122b and the second boundary line 603 between the bottom portion 150 and the second exposed area 124b. For example, the solid lines 602 and 603 of FIG. 6 may coincide with the dotted line 130a of FIG. 7.

Since the side surface of the light emitting device 130 is aligned with the first boundary line 701, light emitted from the light emitting device 130 may increase the surface area, over which light emitted from the light emitting device 130 is reflected by the bottom portion 150, which may enhance light extraction efficiency.

The ratio of the surface area of the bottom portion 150, exposed through the cavity 105 of the package body 110, to the surface area of the first and second lead frames 122 and 124, exposed through the cavity 105 of the package body 110 may be within a range from 1:1.5 to 1:2.5.

For example, the ratio of the surface area of the bottom portion 150, exposed through the cavity 105 of the package body 110, to the sum of the surface area of the first and second contact areas 122a and 124a and the surface area of the first and second exposed areas 122b and 124b may be within a range from 1:1.5 to 1:2.5.

Preferably, the ratio of the surface area of the bottom portion 150, exposed through the cavity 105 of the package body 110, to the sum of the surface area of the first and second contact areas 122a and 124a and the surface area of the first and second exposed areas 122b and 124b may be within a range from 1:1.5 to 1:2.

When the ratio of the surface area of the bottom portion 150, exposed through the cavity 105 of the package body 110, to the sum of the surface area of the first and second contact areas 122a and 124a and the surface area of the first and second exposed areas 122b and 124b is below 1:1.5, the bottom portion 150 cannot serve to attenuate thermal expansion, which may cause deterioration in the reliability of light emitting chip bonding due to strong thermal stress.

On the other hand, when the ratio of the surface area of the bottom portion 150, exposed through the cavity 105 of the package body 110, to the sum of the surface area of the first and second contact areas 122a and 124a and the surface area of the first and second exposed areas 122b and 124b exceeds 1:2.5, light extraction efficiency may be reduced, The bottom portion 150 may serve to attenuate stress caused by the difference between the thermal expansion coefficients of the light emitting device 130, the adhesive member 140, and the first and second lead frames 122 and 124.

In general, since the light emitting device formed of a semiconductor layer and the package body formed of, for example, an EMC resin having high reflectance have a great difference between the thermal expansion coefficients thereof, the light emitting device and the adhesive member may be strongly affected by thermal stress due to heat generated from the light emitting device. This strong thermal stress may cause insulation defects as the passivation layer of the light emitting device is destroyed, and may also cause contact defects as the adhesive member is damaged.

Since the reflectance of the package body is generally higher than the reflectance of the first and second lead frames, in order to enhance light extraction efficiency, only part of the upper surfaces of the first and second lead frames bonded to the light emitting device may be exposed through the cavity of the package body and the remainder exposed through the cavity may be the package body having high reflectance.

That is, the light emitting device package, which has a structure in which the surface area of the package body, exposed through the cavity, is greater than the surface area of the first and second lead frames exposed through the cavity, has a greater difference between the thermal expansion coefficients of the package body and the light emitting device than the difference between the thermal expansion coefficients of the lead frames and the light emitting device.

Therefore, insulation defects of the light emitting device due to thermal stress may occur, or contact defects of the adhesive member may occur.

The embodiment may enhance light extraction efficiency and attenuate the difference between the thermal expansion coefficients of the light emitting device 130 and the package body 110 by maintaining the surface area of the bottom portion 150, exposed through the cavity 105 of the package body 110, and the surface area of the first and second lead frames 122 and 124 exposed through the cavity 105 of the package body 110 within a given range.

Through attenuation of the difference between the thermal expansion coefficients of the light emitting device 130 and the package body 110, the embodiment may prevent insulation defects of the light emitting device 130 due to thermal stress and may also prevent contact defects caused by damage to the adhesive member 140, which may prevent deterioration in the reliability of light emitting chip bonding.

Since the surface area of the bottom portion 150, exposed through the cavity 105, is smaller than the surface area of the first and second lead frames 122 and 124 exposed through the cavity 105, the difference between the thermal expansion of the light emitting device 130 and the thermal expansion of the package body 110 may be attenuated.

The surface area of the first and second contact areas 122a and 124a may be the minimum area required for flip-chip bonding with the light emitting device 130 which will be described below. This serves to enhance the light extraction efficiency of the light emitting device package 100 by minimizing the surface area of the first and second contact areas 122a and 124a as far as possible because the reflectance of the package body 110 is higher than the reflectance of the first and second lead frames 122 and 124.

The light emitting device 130 is disposed on the first and second lead frames 122 and 124. For example, the light emitting device 130 may be disposed on the first and second contact areas 122a and 124a and the thermal expansion attenuation areas.

Figure 8:
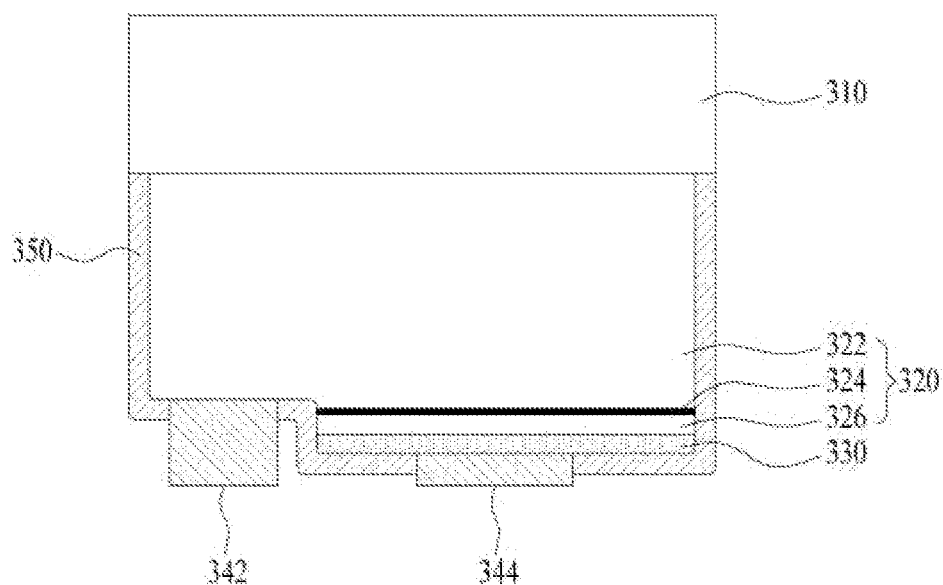
FIG. 8 is a view illustrating one embodiment of the light emitting device illustrated in FIG. 1.

FIG. 8 is a view illustrating one embodiment of the light emitting device 130 illustrated in FIG. 1. The light emitting device 130 includes a substrate 310, a light emitting structure 320, a conductive layer 330, a first electrode 342, a second electrode 344, and a passivation layer 350. For example, the light emitting device 130 may be a flip chip type light emitting diode.

The substrate 310 may be a light transmitting substrate such as, for example, any one of a sapphire substrate, a silicon (Si) substrate, a zinc oxide (ZnO) substrate, and a nitride semiconductor substrate, or may be a substrate on which at least one selected from among GaN, InGaN, AlGaN, AlInGaN, SiC, GaP, InP, $Ga_2O_3$, and GaAs is stacked.

The light emitting structure 320 may include multiple group III-V compound semiconductor layers. For example, the light emitting structure 320 may include a first conductive semiconductor layer 322, a second conductive semiconductor layer 326, and an active layer 324 between the first conductive semiconductor layer 322 and the second conductive semiconductor layer 326.

The side surface of the light emitting structure 320 may be configured as a slope during isolation etching for division on a per unit chip basis. For example, the side surface of the light emitting structure 320 may be a slope inclined from the upper surface of the substrate 310.

The first conductive semiconductor layer 322 may be formed of group III-V compound semiconductors and may be doped with a first conductive dopant. The first conductive semiconductor layer 322 may be formed of a semiconductor material, which may have the composition equation of $In_xAl_yGa_{1-x-y}N$ ($0 \leq x \leq 1$, $0 \leq y \leq 1$, $0 \leq x+y \leq 1$) and may be selected from among, for example, AlGaN, GaN, AlN, InGaN, InA, InAlGaN, AlInN, AlGaAs, GaP, GaAs, GaAsP, and AlGaInP, and the like. The first conductive semiconductor layer 322 may be doped with an n-type dopant such as, for example, Si, Ge, Sn, Se, and Te.

The active layer 324 may generate light using energy generated during recombination of electrons and holes provided from the second conductive semiconductor layer 326 and the first conductive semiconductor layer 322. The active layer 324 may be formed of a semiconductor material having the composition equation of $In_xAl_yGa_{1-x-y}N$ ($0 \leq x \leq 1$, $0 \leq y \leq 1$, $0 \leq x+y \leq 1$) The active layer 324 may have any one of a single quantum well structure, a multi quantum well (MQW) structure, a quantum-dot structure, or a quantum-wire structure.

In the case where the active layer 324 has a multi quantum well structure, the active layer 324 may take the form of a stack of multiple well layers and multiple barrier layers. For example, the well layer/barrier layer of the active layer 324 may have at least one pair configuration of InGaN/GaN, InGaN/InGaN, GaN/AlGaN, InAlGaN/GaN, GaAs(InGaAs)/AlGaAs, and GaP(InGaP)/AlGaP, without being limited thereto. At this time, the energy band gap of the well layer may be smaller than the energy band gap of the barrier layer.

The second conductive semiconductor layer 326 may be formed of group III-V compound semiconductors and may be doped with a second conductive dopant. The second conductive semiconductor layer 326 may be formed of a semiconductor material, which may have the composition equation of $In_xAl_yGa_{1-x-y}N$ ($0 \leq x \leq 1$, $0 \leq y \leq 1$, $0 \leq x+y \leq 1$) and may be selected from among, for example, AlGaN, GaN, AlN, InGaN, InA, InAlGaN, AlInN, AlGaAs, GaP, GaAs, GaAsP, and AlGaInP. The second conductive semiconductor layer 326 may be doped with a p-type dopant such as, for example, Mg, Zn, Ca, Sr, and Ba.

A clad layer (not illustrated) doped with an n-type or p-type dopant may be formed between the active layer 324 and the first conductive semiconductor layer 322, or between the active layer 324 and the second conductive semiconductor layer 326. The clad layer may be a semiconductor layer including AlGaN or InAlGaN.

Although the above description illustrates that the first conductive semiconductor layer 322 includes an n-type semiconductor layer and the second conductive semiconductor layer 326 includes a p-type semiconductor layer, the embodiment is not limited thereto. The first conductive semiconductor layer 322 may include a p-type semiconductor layer and the second conductive semiconductor layer 326 may include an n-type semiconductor layer. In addition, an n-type or p-type semiconductor layer may further be provided under the second conductive semiconductor layer 326.

Accordingly, the light emitting structure 320 may include at least one of nn, pn, npn, and pnp bonding structures. In addition, the dopants of the first conductive semiconductor layer 322 and the second conductive semiconductor layer 326 may have an even or uneven doping density. That is, the configuration of the light emitting structure 320 may be altered in various ways, and the light emitting structure 320 may emit light having various wavelengths.

The conductive layer 330 may be disposed on the second conductive semiconductor layer 326. For example, the conductive layer 330 may be located between the second conductive semiconductor layer 326 and the second electrode 344, and may be in ohmic contact with the second conductive semiconductor layer 326. The conductive layer 330 may reduce total reflection and exhibit high light transmittance, thus increasing the extraction efficiency of light from the active layer 324 to the second conductive semiconductor layer 326. Although not illustrated in FIG. 8, in order to enhance the light extraction efficiency, the second conductive semiconductor layer 326 or the conductive layer 330 may have a ridged surface.

The conductive layer 330 may be formed of a metal in ohmic contact with the second conductive semiconductor layer 326 and, for example, may include at least one selected from among Au, Pd, Pt, Ru, Re, Mg, Zn, Hf, Ta, Rh, Ir, W, Ti, Ag, Cr, Mo, Nb, Al, Ni, Cu, WTi, V, and alloys thereof.

Alternatively, the conductive layer 330 may be formed in a single layer or in multiple layers using a transparent oxide-based material exhibiting high transmittance at wavelengths of emitted light, for example, one or more of Indium Tin Oxide (ITO), Tin Oxide (TO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni, Ag, Ni/IrOx/Au, or Ni/IrOx/Au/ITO.

The light emitting structure 320 may be etched to expose a region of the first conductive semiconductor layer 322 for the arrangement of the first electrode 342. For example, the light emitting structure 320 may be configured such that a region of the first conductive semiconductor layer 322 is exposed as the second conductive semiconductor layer 326, the active layer 324, and the first conductive semiconductor layer 322 are partially etched.

The first electrode 342 may be disposed on the exposed first conductive semiconductor layer 322 and come into contact with the first conductive semiconductor layer 322. In addition, the second electrode 344 may penetrate part of the conductive layer 330 to come into contact with the second conductive semiconductor layer 326, without being limited thereto.

The second electrode 344 may be disposed on the upper surface of the conductive layer 330 and come into contact with the conductive layer 330. The first electrode 342 and the second electrode 344 may be formed of a conductive metal, for example, at least one selected from among Au, Pd, Pt, Ru, Re, Mg, Zn, Hf, Ta, Rh, Ir, W, Ti, Ag, Cr, Mo, Nb, Al, Ni, Cu, WTi, V, or alloys thereof.

The passivation layer 350 may be disposed on the side surface of the light emitting structure 320. For example, the passivation layer 350 may cover the side surface of the light emitting structure 320. In addition, the passivation layer 350 may be disposed on the exposed remaining region of the first conductive semiconductor layer 322 excluding the region in which the first electrode 342 is disposed. In addition, the passivation layer 350 may be disposed on the remaining region of the upper surface of the conductive layer 330 excluding the region in which the second electrode 344 is disposed.

The passivation layer 350 may expose at least a portion of the upper surface of the first electrode 342 and at least a portion of the upper surface of the second electrode 344. The passivation layer 350 may be formed of an insulation material, for example, $SiO_2$, $SiO_x$, $SiO_xN_y$, $Si_3N_4$, or $Al_2O_3$.

In addition, the passivation layer 350 may be a distributed Bragg reflective layer having a double-layer structure in which at least two layers having different indices of refraction are alternately stacked one above another at least one time.

The passivation layer 350 may have a structure in which a first layer having a first index of refraction and a second layer having a second index of refraction which is smaller than the first index of refraction are alternately stacked one above another at least one time.

For example, the passivation layer 350 may include at least one stack comprising a $TiO_2$ layer and an $SiO_2$ layer. The thickness of each of the first layer and the second layer may be $\lambda/4$, where $\lambda$ may mean the wavelength of light emitted from the light emitting structure 320.

The adhesive member 140 is interposed between the first and second contact areas 122a and 124a of the first and second lead frames 122 and 124 and the light emitting device 130 and serves to bond the light emitting device 130 to the first and second contact areas 122a and 124a. In addition, the adhesive member 140 may electrically connect the first and second contact areas 122a and 124a and the light emitting device 130 to each other.

The adhesive member 140 may include a first adhesive member 140-1 and a second adhesive member 140-2. The first adhesive member 140-1 may be interposed between the first electrode 342 of the light emitting device 130 and the first contact area 122a of the first lead frame 122 to bond the first electrode 342 of the light emitting device 130 to the first contact area 122a of the first lead frame 122. In addition, the first adhesive member 140-1 may electrically connect the first contact area 122a of the first lead frame 122 and the first electrode 342 of the light emitting device 130 to each other.

The second adhesive member 140-2 may be interposed between the second electrode 344 of the light emitting device 130 and the second contact area 124a of the second lead frame 124 to bond the second electrode 344 of the light emitting device 130 to the second contact area 124a of the second lead frame 124. In addition, the second adhesive member 140-2 may electrically connect the second contact area 124a of the second lead frame 124 and the second electrode 344 of the light emitting device 130 to each other.

The first and second adhesive members 140-1 and 140-2 may be of a bump type and may be spaced apart from each other. The light emitting device 130 may be flip-chip bonded to the first and second contact areas 122a and 124a.

Figure 9:
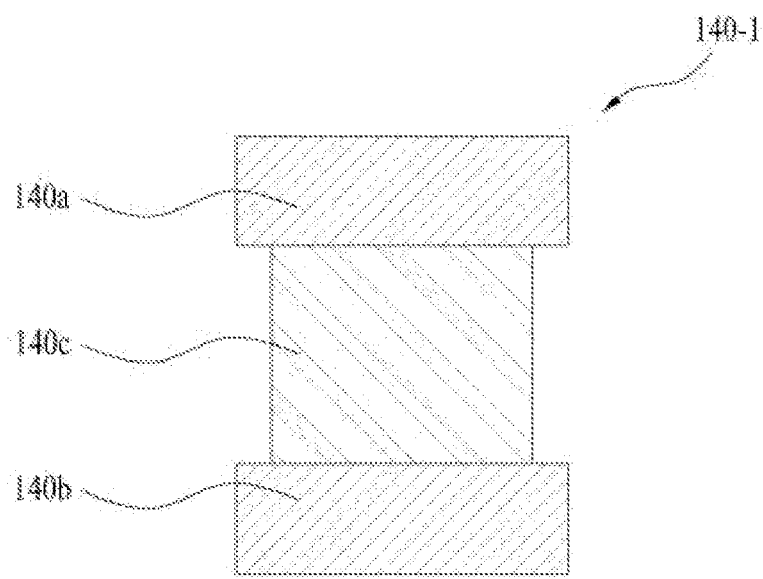
FIG. 9 is a view illustrating one embodiment of a first adhesive member illustrated in FIG. 4.

FIG. 9 is a view illustrating one embodiment of the first adhesive member 140-1 illustrated in FIG. 4. The first adhesive member 140-1 may include a first diffusion prevention adhesive layer 140a which comes into contact with the first electrode 342 of the light emitting device 130, a second diffusion prevention adhesive layer 140b which comes into contact with the first contact area 122a of the first lead frame 122, and a bump 140c which connects the first diffusion prevention adhesive layer 140a and the second diffusion prevention adhesive layer 140b to each other.

The bump 140c may be located between the first electrode 342 of the light emitting device 130 and the first contact area 122a of the first lead frame 122, and may electrically connect the first electrode 342 of the light emitting device 130 and the first contact area 122a of the first lead frame 122 to each other.

The first diffusion prevention adhesive layer 140a is located between the first electrode 342 of the light emitting device 130 and the bump 140c, and bonds the first electrode 342 of the light emitting device 130 and the bump 140c to each other.

The first diffusion prevention adhesive layer 140a serves to increase the adhesion force between the first electrode 342 of the light emitting device 130 and the bump 140c and to prevent ions present in the bump 140c from permeating or diffusing into the light emitting structure 320 through the first electrode 342.

The second diffusion prevention adhesive layer 140b is located between the bump 140c and the first contact area 122a of the first lead frame 122, and bonds the bump 140c and the first contact area 122a of the first lead frame 122 to each other.

The second diffusion prevention adhesive layer 140b serves to increase the adhesion force between the bump 140c and the first contact area 122a of the first lead frame 122 and to prevent ions present in the bump 140c from permeating or diffusing into the first lead frame 122.

While the first adhesive member 140-1 illustrated in FIG. 9 includes the two diffusion prevention adhesive layers 140a and 140b, in another embodiment, at least one of the two diffusion prevention adhesive layers 140a and 140b may be omitted. The second adhesive member 140-2 may have the same configuration as the first adhesive member 140-1 and thus a description thereof will be omitted below in order to avoid repetition.

The resin layer 160 envelopes the light emitting device 130 to protect the light emitting device 130 from an external environment. For example, the resin layer 160 may fill the cavity 105 of the package body 110 to envelope the light emitting device 130, the adhesive member 140, and the bottom portion 150.

The resin layer 160 may be formed of a colorless transparent polymer resin material such as epoxy or silicon. The resin layer 160 may include phosphors to vary the wavelength of light emitted from the light emitting device 130. The thermal expansion coefficient of the resin layer 160 may be smaller than the thermal expansion coefficient of the bottom portion 150.

Through the provision of the bottom portion 150 having a thermal expansion coefficient which is equal to or greater than the thermal expansion coefficient of the package body 110 and is smaller than the thermal expansion coefficients of the adhesive member 140 and the lead frames 122 and 124, the embodiment may prevent insulation defects of the light emitting device 130 due to thermal stress and also prevent contact defects caused by damage to the adhesive member 140, thereby preventing deterioration in the reliability of light emitting chip bonding.

Figure 10:
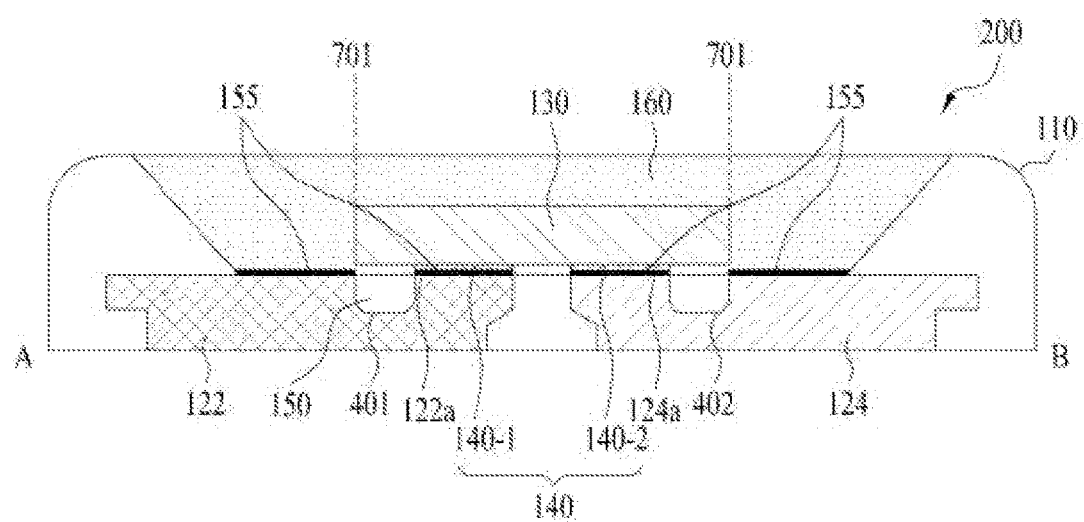
FIG. 10 is a sectional view illustrating a light emitting device package according to another embodiment.

FIG. 10 is a sectional view illustrating a light emitting device package 200 according to another embodiment. The same reference numerals as those of FIGS. 1 and 4 indicate the same components, and these same components will not be described or will be described in brief. The light emitting device package 200 includes the package body 110, the first and second lead frames 122 and 124, the light emitting device 130, the adhesive member 140, the bottom portion 150, a reflective member 155, and the resin layer 160.

The reflective member 155 is disposed on the upper surfaces of the first and second lead frames 122 and 124 exposed through the cavity 105 of the package body 110. For example, the reflective member 155 may be disposed on the first contact area 122a and the first exposed area 122b of the first lead frame 122 and the second contact area 124a and the second exposed area 124b of the second lead frame 124. The constituent material of the reflective member 155 may be a reflective metal, for example, Ag, without being limited thereto. The reflectance of the reflective member 155 may be lower than the reflectance of the bottom portion 150. In another embodiment, in addition to the reflective member 155 illustrated in FIG. 10, a reflective member may be additionally provided on the upper surfaces of the first and second lead frames not exposed through the cavity 105.

Figure 11:
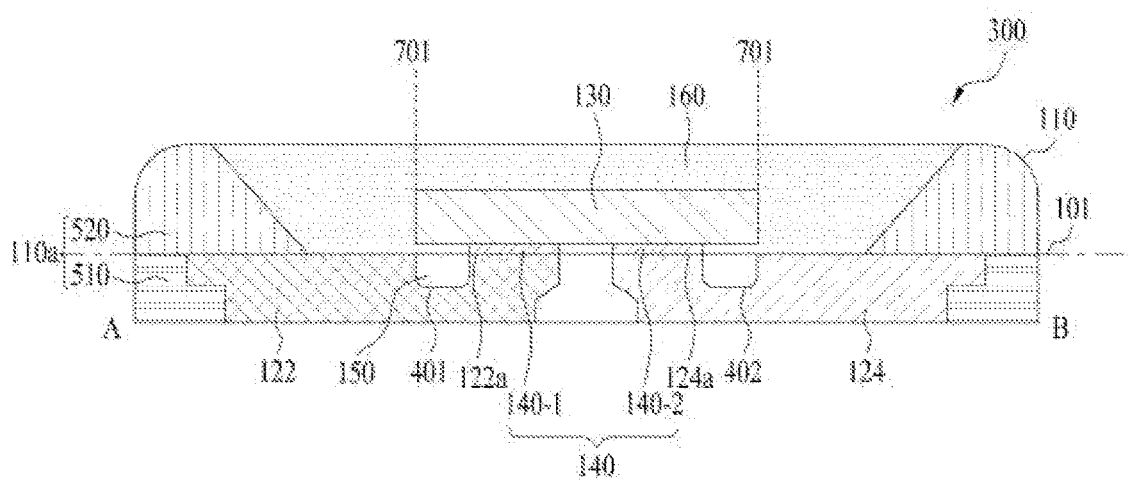
FIG. 11 is a sectional view illustrating a light emitting device package according to another embodiment.

FIG. 11 is a sectional view illustrating a light emitting device package according to another embodiment. The same reference numerals as those of FIGS. 1 and 4 indicate the same components, and these same components will not be described or will be described in brief. The light emitting device package 300 includes a package body 110a, the first and second lead frames 122 and 124, the light emitting device 130, the adhesive member 140, the bottom portion 150, and the resin layer 160. The package body 110a may include a first portion 510 and a second portion 520, which have different thermal expansion coefficients.

For example, the package body 110a may have the same shape as that of the package body 110 illustrated in FIGS. 1 and 4. However, a portion of the upper surface of the first portion 510 may form the bottom 103 of the cavity 105 of the package body 110a, and the inner sidewall of the second portion 520 may form the side surface 102 of the cavity 105 of the package body 110a.

The first portion 510 of the package body 110a may be a portion, in which the first and second lead frames 122 and 124 are arranged, and may be located below a virtual reference plane 101 which is parallel to the upper surfaces of the first and second lead frames 122 and 124. The second portion 520 of the package body 110a may be a portion located on the first portion 510. For example, the second portion 520 of the package body 110a may be located above the reference plane 101.

While the package body 110 illustrated in FIGS. 1 and 4 are formed of a single material, the package body 110a illustrated in FIG. 11 has a difference in that it includes the first portion 510 having a first thermal expansion coefficient and the second portion 520 having a second thermal expansion coefficient which is different from the first thermal expansion coefficient. For example, the first thermal expansion coefficient may be greater than the second thermal expansion coefficient.

For example, the first thermal expansion coefficient may be equal to the thermal expansion coefficient of the first and second lead frames 122 and 124, and the second thermal expansion coefficient may be equal to the thermal expansion coefficient of the resin layer 160.

As the first portion 510 of the package body 110a, which comes into contact with the first and second lead frames 122 and 124, is formed of a material having the first thermal expansion coefficient, and the second portion 520 of the package body 110a, which comes into contact with the resin layer 160, is formed of a material having the second thermal expansion coefficient, it is possible to reduce thermal stress attributable to the difference between the thermal expansion coefficients, to prevent the breakage of the passivation layer 350 of the light emitting device 130 due to the thermal stress, and to prevent damage to the adhesive member 140.

The thermal expansion coefficient of the bottom portion 150 may be greater than the thermal expansion coefficient of the first portion 510 of the package body 110a. The bottom portion 150 may be identical to the above description with reference to FIGS. 1 to 5.

The light emitting device package according to another embodiment may further include a reflective member, for example, Ag, which is disposed on the first and second lead frames 122 and 124 as illustrated in FIG. 11.

Figure 12:
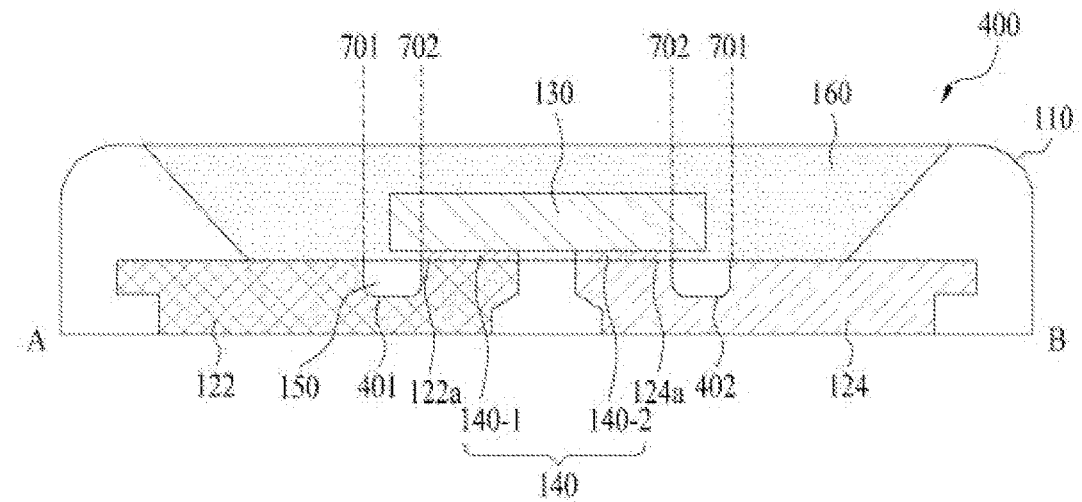
FIG. 12 is a sectional view illustrating a light emitting device package according to another embodiment.

FIG. 12 is a sectional view illustrating a light emitting device package 400 according to another embodiment. The same reference numerals as those of FIGS. 1 and 4 indicate the same components, and these same components will not be described or will be described in brief. Compared to the embodiment illustrated in FIG. 4, the edge of the light emitting device 130 according to the embodiment of FIG. 12 may be vertically aligned with at least a portion of the bottom portion 150. For example, the side surface of the light emitting device 130 may be vertically aligned between the first boundary line 701 and the second boundary line 702.

The first boundary line 701 includes the boundary line 602 between the bottom portion 150 and the first exposed area 122b and the boundary line 603 between the bottom portion 150 and the second exposed area 124b. The second boundary line 702 may include boundary lines between the bottom portion 150 and the first and second contact areas 122a and 124a.

This configuration of FIG. 12 in which the edge of the light emitting device 130 is aligned between the first boundary line 701 and the second boundary line 702 may also be applied to the embodiments 100, 200 and 300 described above.

Figure 13:
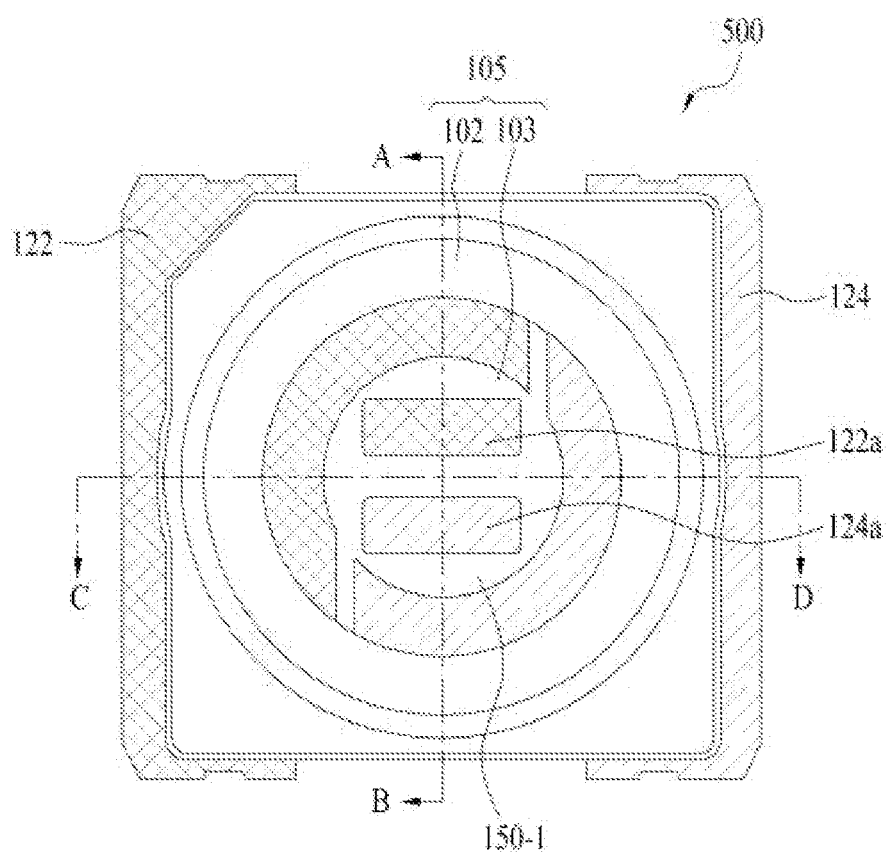
FIG. 13 is a sectional view illustrating a light emitting device package according to another embodiment.

FIG. 13 is a sectional view illustrating a light emitting device package 500 according to another embodiment. The same reference numerals as those of FIG. 3 indicate the same components, and these same components will not be described or will be described in brief. A bottom portion 150-1 of the light emitting device package 500 has a different shape from that of the bottom portion 150 illustrated in FIG. 3.

In the embodiment of FIG. 3, the boundary lines between the bottom portion 150 and the first and second exposed areas 122b and 124b may have a quadrangular shape, for example, a square shape. However, in the embodiment of FIG. 13, the boundary lines between the bottom portion 150 and the first and second exposed areas 122b and 124b may have a circular or oval shape.

The shape of the bottom portion 150-1 is not limited to the aforementioned shape, and may be implemented into various shapes such as, for example, a polygonal, circular, oval shape. To achieve even light extraction and even thermal expansion attenuation, the shape of the bottom portion 150-1 may be symmetrical about the center of the cavity 105, without being limited thereto.

Figure 14A:
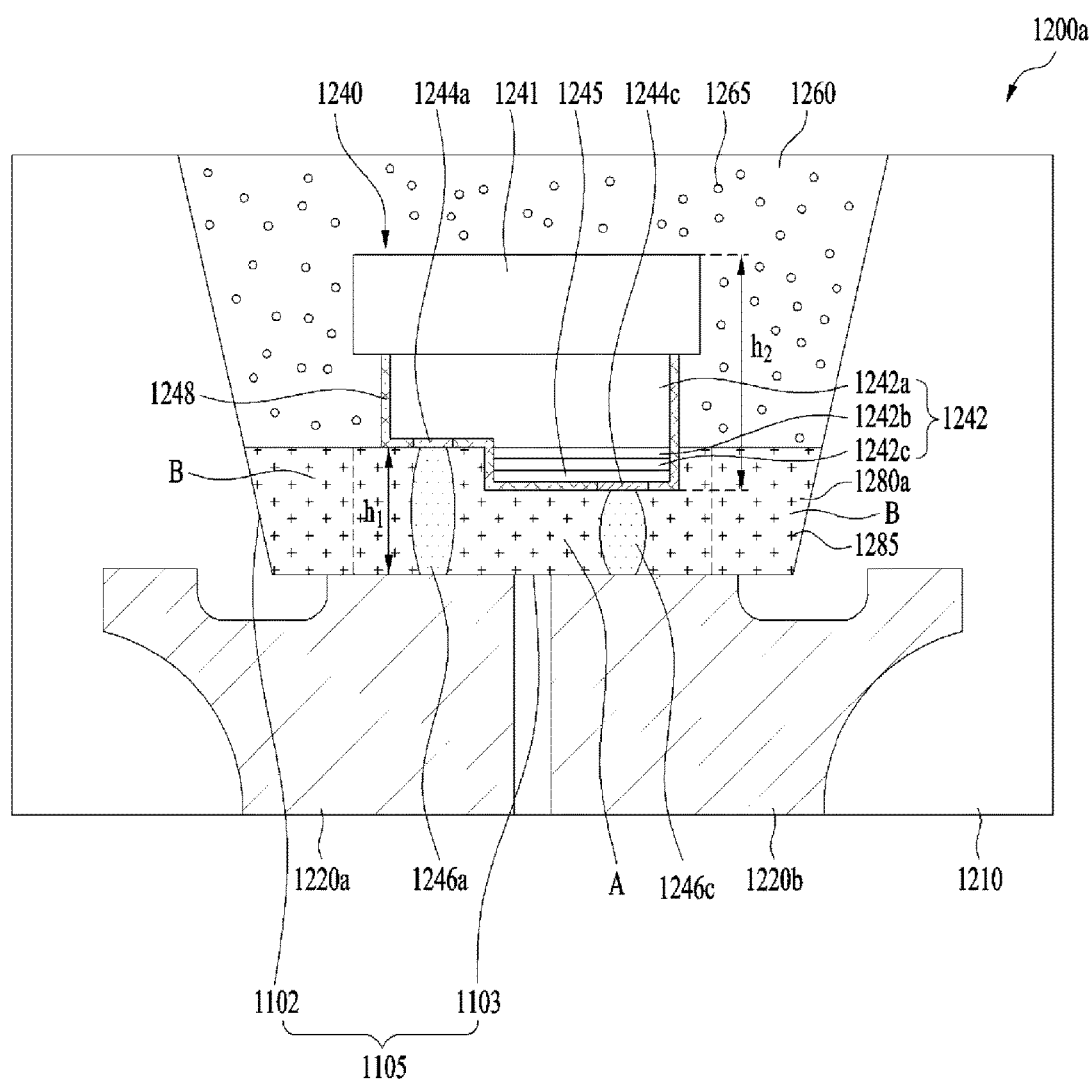
FIGS. 14A to 14C are views illustrating light emitting device packages according to other embodiments.
Figure 14B:
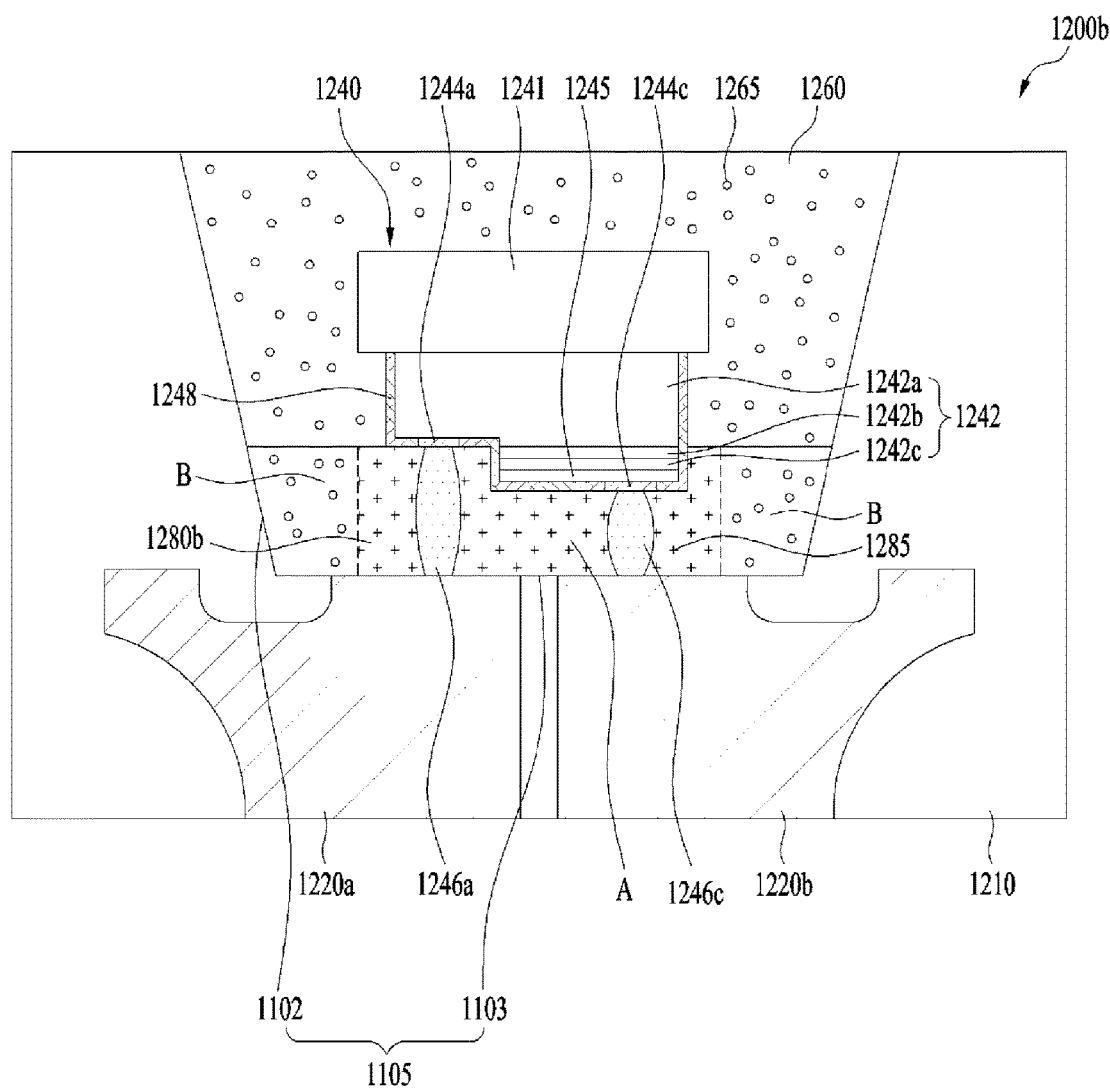
Figure 14C:
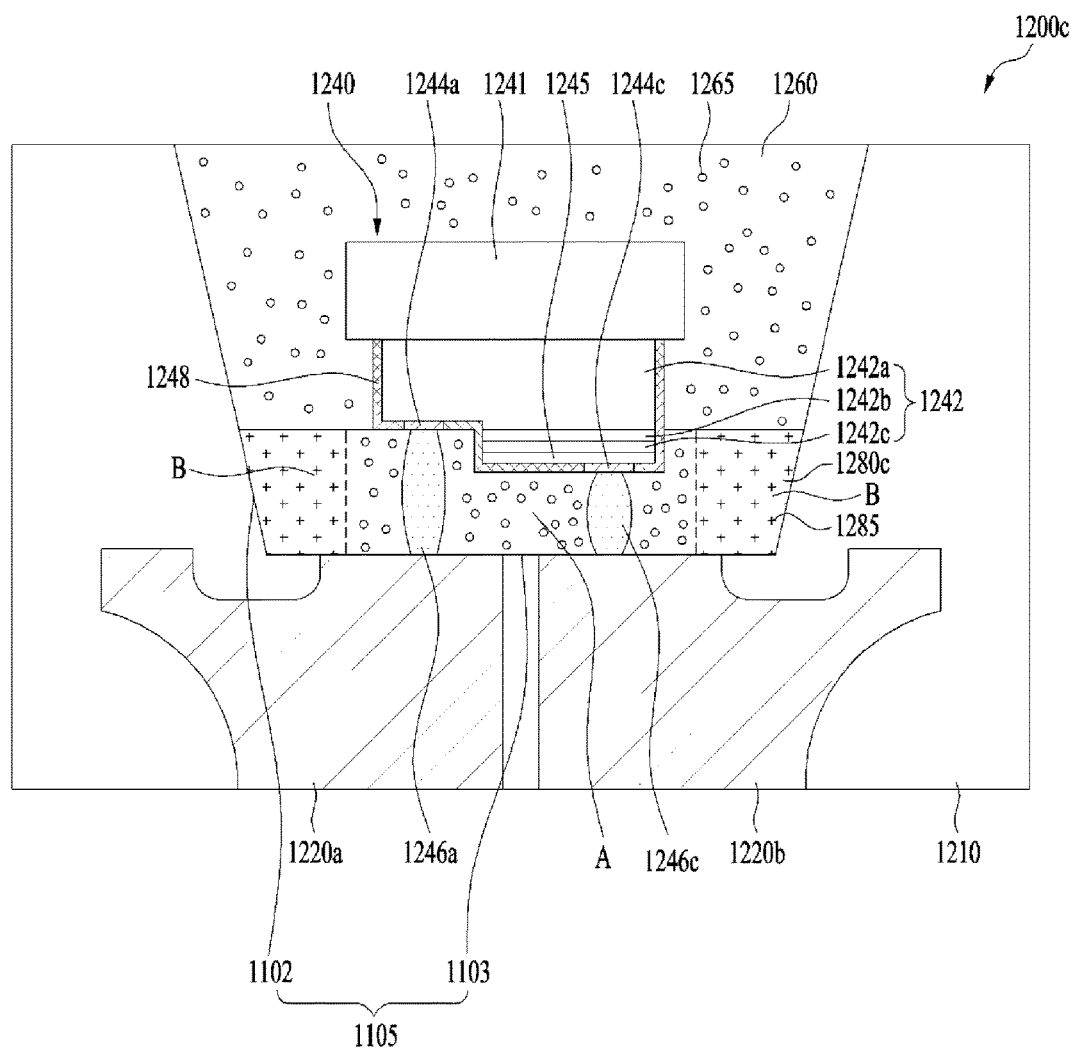

FIGS. 14A to 14C are views illustrating light emitting device packages according to other embodiments.

A light emitting device package 1200a includes a package body 1210 having a cavity 1105, a first lead frame 1220a and a second lead frame 1220b located in the package body 1210, a light emitting device 1240 located in the package body 1210 and electrically connected to the first lead frame 1220a and the second lead frame 1220b via conductive adhesives 1246a and 1246c, a reflective layer 1280a located in a lower region of the cavity 1105, and a molding part 1260 located in an upper region of the cavity 1105.

The package body 1210 may be formed of a silicon material, a synthetic resin material, or a metal material. When the package body 210 is formed of a conductive material such as, for example, a metal material, although not illustrated, an insulation layer may be coated over the surface of the package body 1210 to prevent electric short-circuit between the first and second lead frames 1220a and 1220b.

The cavity 1105 may be formed inside the package body 1210 and may include a bottom surface 1103, on which the light emitting device 1240 is disposed, and a sidewall 1102 inclined by a predetermined gradient relative to the bottom surface 1103.

The first lead frame 1220a and the second lead frame 1220b are partially exposed from the bottom surface 1103 of the cavity 1105 and are arranged inside the package body 1210 so as to be electrically isolated from each other. The first lead frame 1220a and the second lead frame 1220b serve to supply current to the light emitting device 1240. In addition, the first lead frame 1220a and the second lead frame 1220b may increase luminous efficacy by reflecting light emitted from the light emitting device 1240, and may outwardly radiate heat generated in the light emitting device 1240.

The light emitting device 1240 may be a flip chip type light emitting device. For example, the light emitting device 1240 may include a substrate 1241, and a light emitting structure 1242 disposed on the substrate 1241, the light emitting structure 1242 including a first conductive semiconductor layer 1242a, an active layer 1242b, and a second conductive semiconductor layer 1242c.

The substrate 1241 may be formed of the same material as the substrate 310 described above with reference to FIG. 8. The first conductive semiconductor layer 1242a may be formed of the same material as the first conductive semiconductor layer 322 described above with reference to FIG. 8, the active layer 1242b may be formed of the same material as the active layer 324 described above with reference to FIG. 8, and the second conductive semiconductor layer 1242c may be formed of the same material as the second conductive semiconductor layer 326 described above with reference to FIG. 8.

Although not illustrated, an electron blocking layer may be interposed between the active layer 1242b and the second conductive semiconductor layer 1242c. The electron blocking layer may have a super-lattice structure. For example, a super-lattice may include AlGaN layers doped with a second conductive dopant and GaN layers, which are alternately arranged.

The light emitting device 1240 may further include a light transmitting conductive layer 1245 disposed on the second conductive semiconductor layer 1242c. The light transmitting conductive layer 1245 may be formed of the same material as the conductive layer 330 described above with reference to FIG. 8.

The light emitting device 1240 may further include a first electrode 1244a electrically connected to the first conductive semiconductor layer 1242a and a second electrode 1244b electrically connected to the light transmitting conductive layer 1245. The first electrode 1244a and the second electrode 1244c may be formed of the same material as the first electrode 342 and the second electrode 344 described above with reference to FIG. 8.

To dispose the first electrode 1244a on the first conductive semiconductor layer 1242a, the light transmitting conductive layer 1245, the second conductive semiconductor layer 1242c, the active layer 1242b, and the first conductive semiconductor layer 1242a are partially etched in this sequence to expose a part of the surface of the first conductive semiconductor layer 1242a. The first electrode 1244a may be disposed on the exposed surface.

A passivation layer 1248 may be formed around the light emitting structure 1242. The passivation layer 1248 may be formed of an insulation material such as a nonconductive oxide or nitride. In one example, the passivation layer 1248 may be a silicon oxide (SiO2) layer, an oxide nitride layer, or an oxide aluminum layer. In addition, as illustrated, the passivation layer 248 may not be formed in a region in which the first electrode 1244a and the second electrode 1244c are arranged.

The first electrode 1244a and the second electrode 1244c of the light emitting device 1240 may respectively come into electrical contact with the first lead frame 1220a and the second lead frame 1220b via the conductive adhesives 1246a and 1246c. The conductive adhesives 1246a and 1246c may be formed of a conductive material such as, for example, solder.

The reflective layer 1280a may be disposed on the bottom surface 1103 of the cavity 1105. The reflective layer 1280a may be configured such that a reflective material 1285 is included in a base material. The reflective material 1285 may be titanium oxide (TiO2) and the base material may be silicon. In particular, when the base material of the reflective layer 1280a is the same as the base material of the package body 1210, excellent coupling force between the reflective layer 1280a and the package body 1210 may be accomplished.

The height h1 of the reflective layer 1280a may be equal to or higher than the height of the conductive adhesives 1246a and 1246c. While the conductive adhesives 1246a and 1246c are illustrated as having different heights, the respective heights may be about 30 μm and the difference therebetween may be within a few micrometers. The height h2 of the light emitting device 240 may be within a range from 100 μm to 200 μm. For example, the height h1 of the reflective layer 1280a may be the height from the bottom surface 1103 of the cavity 1105 to the upper surface of the reflective layer 1280a, and the height of the conductive adhesives 1246a and 1246c may be the height from the bottom surface 1103 of the cavity 1105 to the uppermost ends of the conductive adhesives 1246a and 1246c.

The reflective layer 1280a may be disposed to surround the conductive adhesives 1246a and 1246c and may come into contact with the conductive adhesives 1246a and 1246c.

This arrangement of the reflective layer 1280a is provided because the material of the reflective layer 1280a is injected to the bottom surface 1103 of the cavity 1105 after the conductive adhesives 1246a and 1246c are applied to the first lead frame 1220a and the second lead frame 1220c and the first electrode 1244a and the second electrode 1244c of the light emitting device 1240 are bonded to the conductive adhesives 1246a and 1246c.

The lower region of the cavity 1105 may be provided with the reflective layer 1280a and the upper region of the cavity 1105 may be filled with the molding part 1260. The molding part 1260 may include a base material such as a silicon or epoxy based material and phosphors 1265. The phosphors 1265 may be excited by light in the first wavelength range emitted from the active layer 1242b, thereby emitting light in the second wavelength range which is wider than the first wavelength range.

Since the reflective layer 1280a and the molding part 1260 may include the same base material, bonding at the interface may be performed without the generation of cracks, etc.

When the bottom surface 1103 of the cavity 1105 is divided into a first region A corresponding to the light emitting device 1240 and a second region B around the first region A, in FIG. 14A, the reflective layer 1280a is disposed on both the first region A and the second region B. For example, the second region B may be the remainder region of the bottom surface 1103 of the cavity 1105 excluding the first region A.

In the light emitting device package 1200a according to the embodiment, light emitted from the active layer 1242b and directed to the bottom surface 1103 of the cavity 1105 may be reflected by the reflective layer 1280a, which may increase light extraction efficiency. In particular, the reflective layer 1280a having the height described above may prevent the absorption of light by the conductive adhesives 1246a and 1246c.

In addition, although the characteristics of light may be deteriorated due to the oxidation of the reflective material when a silver (Ag) based reflective material is coated over the lead frames 1220a and 1220b, the embodiment does not have this problem, and the reflective layer 1280a, which is formed of a mixture of silicon and titanium oxide, has the reflectance of 98%, which is superior to the reflectance of 90% of the Ag based reflective material.

A light emitting device package 1200b according to the embodiment illustrated in FIG. 14B is similar to that of the embodiment illustrated in FIG. 14A, but has a difference in that a reflective layer 1280b is disposed only on the first region A corresponding to the light emitting device 1240 and the molding part 1260 including the phosphors 1265 is disposed on the second region B.

A light emitting device package 1200c according to the embodiment illustrated in FIG. 14C is similar to that of the embodiment illustrated in FIG. 14A, but has a difference in that a reflective layer 1280c is disposed only on the second region B corresponding to the periphery of the light emitting device 1240 and the molding part 1260 including the phosphors 1265 is disposed on the first region A.

Figure 15:
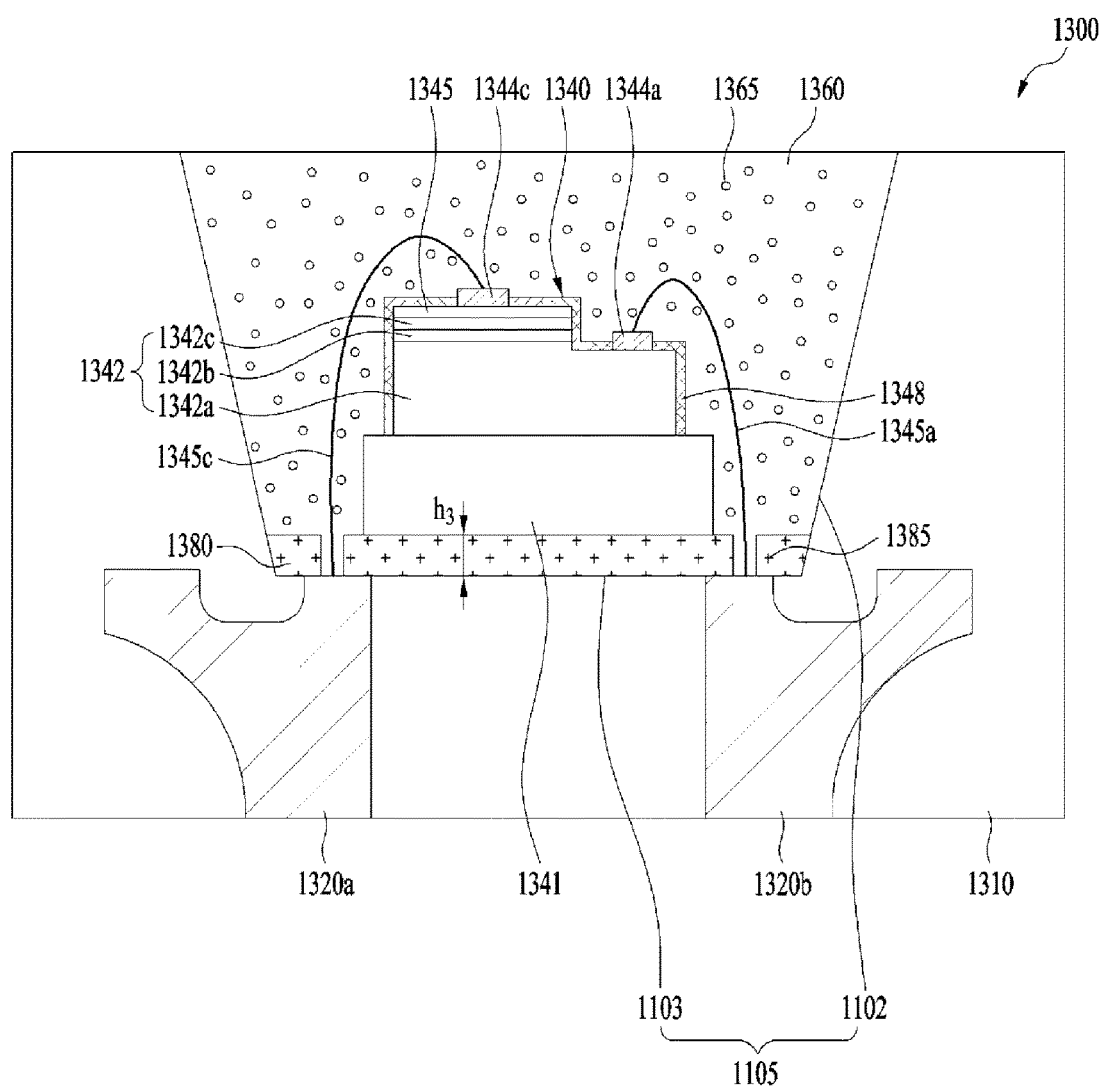
FIG. 15 is a view illustrating a light emitting device package according to another embodiment.

FIG. 15 is a view illustrating a light emitting device package 1300 according to another embodiment. The following description will focus on differences with the embodiments illustrated in FIGS. 14A to 14C.

The light emitting device package according to the embodiment may include a horizontal type light emitting device 1340, rather than a flip chip type light emitting device illustrated in FIGS. 14A to 14C. In the light emitting device package 1300, although a great flux of light is not directed to the bottom surface 1103 of the cavity 1105, light reflected by the sidewall 1102 of the cavity 1105 is directed to the bottom surface 1103 of the cavity 1105 and then reflected by a reflective layer 1380, which may improve luminous efficacy.

The light emitting device 1340 is similar to the light emitting device 1240 of FIG. 14A, but is inverted. In addition, although not illustrated, the light emitting device 1340 may be adhered to a package body 1310 via a conductive or non-conductive adhesive.

A first electrode 1344a and a second electrode 1344c are electrically connected to a first lead frame 1320a and a second lead frame 1320b respectively via wires 1345a and 1345c. The reflective layer 1380 is disposed on the bottom surface 1103 of the cavity 1105. The reflective layer 1380 includes a reflective material 1385 distributed in a base material, and the detailed composition thereof may be identical to the description of FIGS. 14A to 14C.

To implement electrical contact with the first and second lead frames 1320a and 1320b, the conductive adhesives 1246a and 1246c described in FIGS. 14A to 14C are replaced with the wires 1345a and 1345c. As such, since there is no possibility of absorption of light by the conductive adhesives 1246a and 1246c, the reflective layer 1380 may have a smaller thickness h3 than that of the reflective layer 1280a, 1280b, or 1280c of FIGS. 14A to 14C.

In the embodiment of FIG. 15, the reflective layer 1380 is located around one end of the respective wires 1345a and 1345c coming into contact with the first and second lead frames 1320a and 1320b, but does not come into contact with the end of the respective wires 1345a and 1345c. However, in another embodiment, the reflective layer 1380 may come into contact with the outer circumferential surface of one end of the respective wires 1345a and 1345c.

Figure 16:
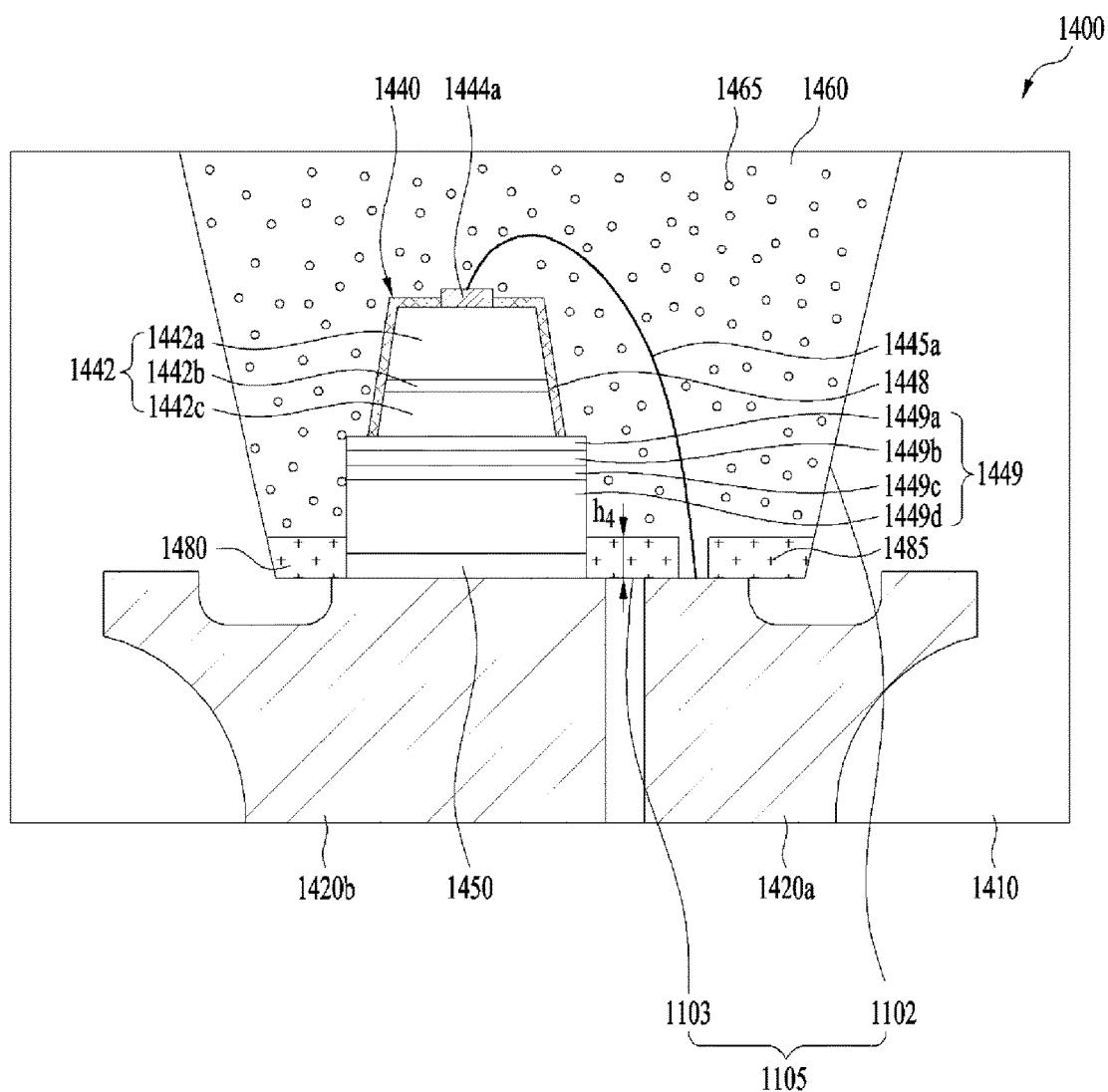
FIG. 16 is a view illustrating a light emitting device package according to a further embodiment.

FIG. 16 is a view illustrating a light emitting device package 1400 according to a further embodiment. The following description will focus on differences with the above-described embodiments. The light emitting device package 1400 may include a vertical type light emitting device 1440, rather than the flip chip type light emitting device 1240 illustrated in FIGS. 14A to 14C. In the light emitting device package 1400, although a great flux of light is not directed to the bottom surface 1103 of the cavity 1105, light reflected by the sidewall 1102 of the cavity 1105 is directed to the bottom surface 1103 of the cavity 1105 and then reflected by a reflective layer 1480, which may improve luminous efficacy.

The light emitting device 1440 may include a second electrode 1449, a light emitting structure 1442 disposed on the second electrode 1449, a passivation layer 1448, and a first electrode 1444a. The second electrode 1449 may include a conductive support substrate 1449d, a bonding layer 1449c, a reflective layer 1449b, and an ohmic layer 1449a.

A light extraction structure may be formed on the surface of the light emitting structure 1442. The light emitting structure 1442 may include a first conductive semiconductor layer 1442a, an active layer 1442b, and a second conductive semiconductor layer 1442c.

The ohmic layer 1449a may have a thickness of about 200 Å. The ohmic layer 1449a may be formed of at least one selected from among Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited to these materials.

The reflective layer 1449b may be a metal layer formed of aluminum (Al), silver (Ag), nickel (Ni), platinum (Pt), rhodium (Rh), or alloys including Al, Ag, Pt or Rh. Aluminum, silver, or the like may effectively reflect light emitted from the active layer 1442b to significantly enhance light-extraction efficiency of the light emitting device 1440.

The conductive support substrate 1449d (e.g., a metal support substrate) may be formed of a metal having high electric conductivity. More particularly, the support substrate 1449d may be formed of a metal having high thermal conductivity because it needs to sufficiently dissipate heat generated during operation of the light emitting device 1440.

For example, the conductive support substrate 1449d may be formed of a metal or a semiconductor material. In addition, the conductive support substrate 1449d may be formed of a material having high electric conductivity and thermal conductivity. For example, the conductive support substrate 1449d may be formed of a material selected from the group of molybdenum (Mo), silicon (Si), tungsten (W), copper (Cu) and aluminum (Al), or alloys thereof. In addition, the support substrate 1449d may selectively include gold (Au), copper (Cu) alloy, nickel (Ni), copper-tungsten (Cu—W), carrier wafer (e.g., GaN, Si, Ge, GaAs, ZnO, SiGe, SiC, SiGe, Ga$_2$O$_3$).

The conductive support substrate 1449d may have a sufficient mechanical strength to be efficiently separated as a chip during a scribing process and a breaking process without causing bending of a nitride semiconductor device.

The bonding layer 1449c may be interposed between the reflective layer 1449b and the conductive support substrate 1449d to bond the same to each other. For example, the bonding layer 1449c may be formed of a material selected from the group of gold (Au), tin (Sn), indium (In), aluminum (Al), silicon (Si), silver (Ag), nickel (Ni), and copper (Cu), or alloys thereof.

The first electrode 1444a may be disposed on the first conductive semiconductor layer 1442a, and may be formed of at least one of aluminum (Al), titanium (Ti), chrome (Cr), nickel (Ni), cooper (Cu), and gold (Au). The first electrode 1444a may have a single layer or multi-layer structure.

The second electrode 1449 of the light emitting device 1440 may be electrically connected to the second lead frame 1420b via a conductive adhesive layer 1450. The first electrode 1444a may be electrically connected to the first lead frame 1420a via a wire 1445a. In addition, the reflective layer 1480 is disposed on the bottom surface 1103 of the cavity 1105. The reflective layer 1480 may include a reflective material 1485 distributed in a base material, and the detailed composition thereof may be identical to the above description.

As a result of implementing the electrical contact between the first lead frame 1420a and the first electrode 1444a using the wire 1445a, the surface area of a region of the first lead frame 1420a exposed by the reflective layer 1480 may be reduced, which may enhance light extraction efficiency.

The thickness $h_4$ of the reflective layer 1480 may be greater than the thickness of the conductive adhesive layer 1450. Thereby, the embodiment may enhance the light extraction efficiency by preventing the absorption of light by the conductive adhesive layer 1450.

The reflective layer 1480 illustrated in FIG. 16 is disposed around one end of the wire 1445a which comes into contact with the first lead frame 1420a and, thus, the reflective layer 1480 does not come into contact with the end of the wire 1445a. However, in another embodiment, the reflective layer 1480 may come into contact with the outer circumferential surface of one end of the wire 1445a.

The light emitting device packages described above may include a plurality of light emitting devices, rather than a single light emitting device, without being limited thereto.

A plurality of light emitting device packages according to the embodiment may be disposed on a board, and optical members such as, for example, a light guide plate, a prism sheet, and a diffusion sheet may be disposed in the optical path of the light emitting device package. The light emitting device package, the board, and the optical members may function as a backlight unit.

Other embodiments may be implemented into a display apparatus, an indicator apparatus, and a lighting system including the light emitting device or the light emitting device package according to the above-described embodiments. For example, the lighting system may include a lamp, a vehicle lamp, and a street light.

Figure 17:
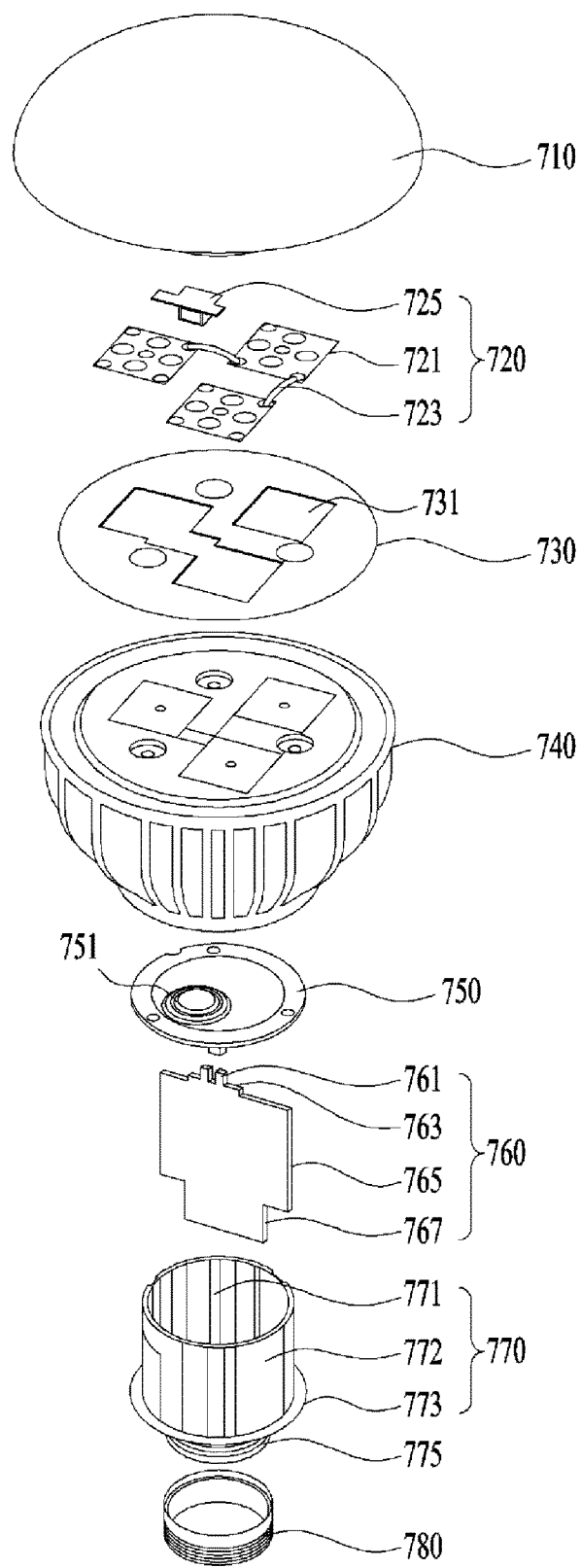
FIG. 17 is a view illustrating a lighting apparatus including the light emitting device package according to any of the embodiments.

FIG. 17 is a view illustrating a lighting apparatus including the light emitting device package according to any of the embodiments. The lighting apparatus may include a cover 710, a light source module 720, a radiator 740, a power provider 760, an inner case 770 and a socket 780. In addition, the lighting apparatus according to the embodiment may further include a member 730 and/or a holder 750.

The cover 710 may take the form of a hollow bulb or semi-sphere, a portion of which is open. The cover 710 may be optically coupled to the light source module 720. For example, the cover 710 may perform diffusion, scattering or excitation of light emitted from the light source module 720.

The cover 710 may be a type of optical member. The cover 710 may be coupled to the radiator 740. To this end, the cover 710 may have a coupling portion for the radiator 740.

The inner surface of the cover 710 may be coated with an ivory white paint. The ivory white paint may comprise a diffuser to diffuse light. The inner surface of the cover 710 may have a surface roughness greater than the surface roughness of the outer surface of the cover 710. This serves to sufficiently scatter and diffuse light from the light source module 720 so as to radiate the light outward.

The cover 710 may be formed of glass, plastic, polypropylene (PP), polyethylene (PE), or polycarbonate (PC), for example. Here, polycarbonate has high light resistance, heat resistance, and strength. The cover 710 may be transparent to allow the light source module 720 to be visible from the outside, without being limited thereto. The cover 1100 may be opaque. The cover 1100 may be formed by blow molding.

The light source module 720 may be disposed on one surface of the radiator 740 and heat generated from the light source module 720 may be transferred to the radiator 840 by conduction. The light source module 720 may include light source units 721, connection plates 723, and a connector 725. Each of the light source units 721 may include may include one of the light emitting device packages 100 to 500, 1200a, 1200c, 1300, and 1400 according to the embodiments.

The member 730 may be disposed on the upper surface of the radiator 740 and has guide recesses 731, into which the respective light source units 721 and the connector 725 are inserted. The guide recesses 731 may correspond to or be aligned with the boards of the light source units 721 and the connector 725.

A light reflecting material may be applied to or coated over the surface of the member 730. For example, a white paint may be applied to or coated over the surface of the member 730. When light is reflected from the inner surface of the cover 730 and returned to the light source module 720, the member 730 may again reflect the light to the cover 710. This may result in enhanced luminous efficacy of the lighting apparatus according to the embodiment.

The member 730 may be formed of an insulation material, for example. The connection plates 723 of the light source module 720 may be formed of an electrically conductive material. Thus, electrical contact between the radiator 740 and the connection plates 723 may occur. The member 730 formed of the insulation material may prevent electric short-circuit between the connection plates 723 and the radiator 740. The radiator 740 may radiate heat from the light source module 720 and heat from the power provider 760.

The holder 750 blocks a receiving bore 771 of an insulating portion 710 of the inner case 770. As such, the power provider 760 received in the insulating portion 710 of the inner case 770 may be sealed. The holder 750 may have a guide protrusion 751 and the guide protrusion 751 may have a hole for penetration of a protrusion 761 of the power provider 760.

The power provider 760 processes or converts an external electrical signal to provide the same to the light source module 720. The power provider 760 may be received in the receiving bore 771 of the inner case 770 and be sealed in the inner case 770 by the holder 750. The power provider 760 may include a protrusion 761, a guide portion 763, a base 765 and an extension 767.

The guide portion 763 may protrude outward from one side of the base 765. The guide portion 763 may be inserted into the holder 750. A plurality of elements may be disposed on one surface of the base 765. The elements, for example, may include a DC converter which converts Alternating Current (AC) power from an external power source into Direct Current (DC) power, a drive chip which controls driving of the light source module 720, and an Electro Static Discharge (ESD) protection element that protects the light source module 720, without being limited thereto.

The extension 767 may protrude outward from the other side of the base 765. The extension 767 may be inserted into a connecting portion 775 of the inner case 770 and receive an electrical signal from the outside. For example, the extension 767 may have a width equal to or less than the width of the connecting portion 775 of the inner case 770. The extension 767 may be electrically connected to one end of "a positive electric wire" and one end of "a negative electric wire" and the other ends of "the positive electric wire" and "the negative electric wire" may be electrically connected to the socket 780.

The inner case 770 may receive a molding part as well as the power provider 760 therein. The molding part is prepared by hardening molding liquid and assists the power provider 760 in being fixed in the inner case 770.

Figure 18:
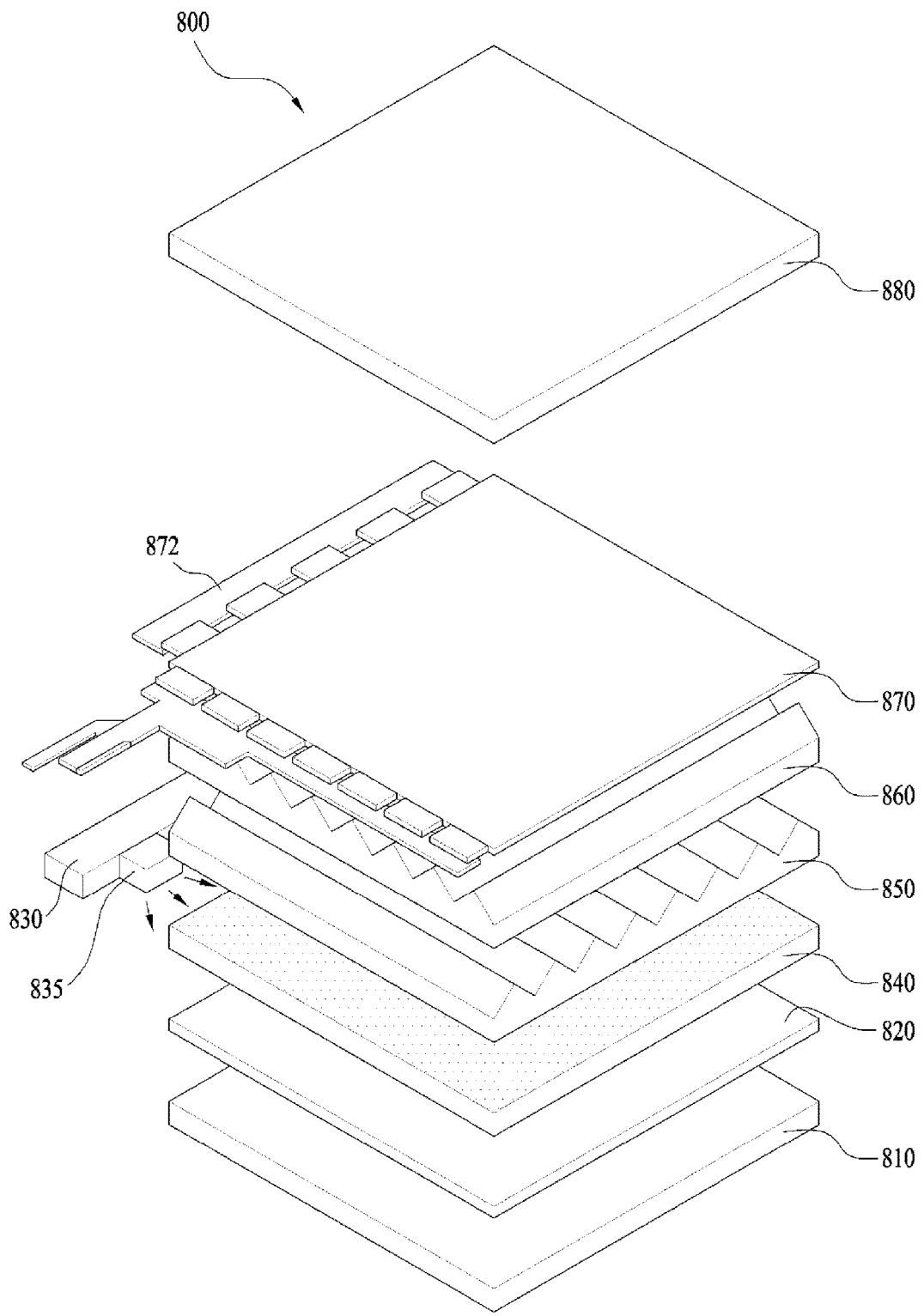
FIG. 18 is a view illustrating a display apparatus including the light emitting device package according to any of the embodiments.

FIG. 18 is a view illustrating a display apparatus including the light emitting device package according to any of the embodiments. The display apparatus 800 may include a bottom cover 810, a reflective plate 820 disposed on the bottom cover 810, a light emitting module 830 and 835 to emit light, a light guide plate 840 disposed in front of the reflective plate 820 to guide light emitted from the light emitting module 830 and 835 forward of the display apparatus 800, optical sheets including prism sheets 850 and 860 disposed in front of the light guide plate 840, a display panel 870 disposed in front of the optical sheets, an image signal output circuit 872 connected to the display panel 870 to supply an image signal to the display panel 870 and a color filter 880 disposed in front of the display panel 870. Here, the bottom cover 810, the reflective plate 820, the light emitting module 830 and 835, the light guide plate 840 and the optical sheets may constitute a backlight unit.

The light emitting module may include light emitting device packages 835 mounted on a board 830. Here, the board 830 may be a Printed Circuit Board (PCB) or the like. The light emitting device packages 835 may be based on any one of the above-described embodiments 100 to 500, 1200a to 1200c, 1300, and 1400.

The bottom cover 810 may receive constituent elements of the display apparatus 800. The reflective plate 820 may be a separate element as exemplarily illustrated in the drawing, or may be a high reflectivity material coated on the back surface of the light guide plate 840 or the front surface of the bottom cover 810.

The reflective plate 820 may be formed of a material which has high reflectance and may be formed into an ultra thin shape. For example, the reflective plate 820 may be formed of polyethyleneterephthalate (PET). The light guide plate 840 may be formed of polymethylmethacrylate (PMMA), or polycarbonate (PC) polyethylene (PE), for example.

The first prism sheet 850 may include a support film and a translucent elastic polymer material formed on one surface of the support film. The polymer material may form a prism layer provided with a plurality of repeatedly formed 3-dimensional structures. Here, the structures may define a stripe type pattern including ridges and valleys repeatedly formed as illustrated.

In addition, in the second prism sheet 860, the direction of ridges and valleys formed on one surface of a support film may be perpendicular to the direction of the ridges and valleys formed on one surface of the support film of the first prism sheet 850. This allows light transmitted from the light emitting module and the reflective plate to be uniformly distributed throughout the display panel 870.

In addition, although not illustrated, a diffusion sheet may be located between the light guide plate 840 and the first prism sheet 850. The diffusion sheet may be formed of any one of polyester and polycarbonate based materials and may maximize a light projection angle via the refraction and scattering of light introduced from the backlight unit. In addition, the diffusion sheet may include a support layer containing a light diffuser, and first and second layers formed respectively on the light emission surface (facing the first prism sheet) and the light introduction surface (facing the reflective sheet), the first and second layers containing no light diffuser.

In the embodiment, the diffusion sheet, the first prism sheet 850 and the second prism sheet 860 serve as optical sheets. As examples of other combinations of optical sheets, a micro-lens array, a combination of a diffusion sheet and a micro-lens array, or a combination of a single prism sheet and a micro-lens array may be provided.

The display panel 870 may be a liquid crystal display panel, or may be any one of various other kinds of display devices requiring a light source.

Figure 19:
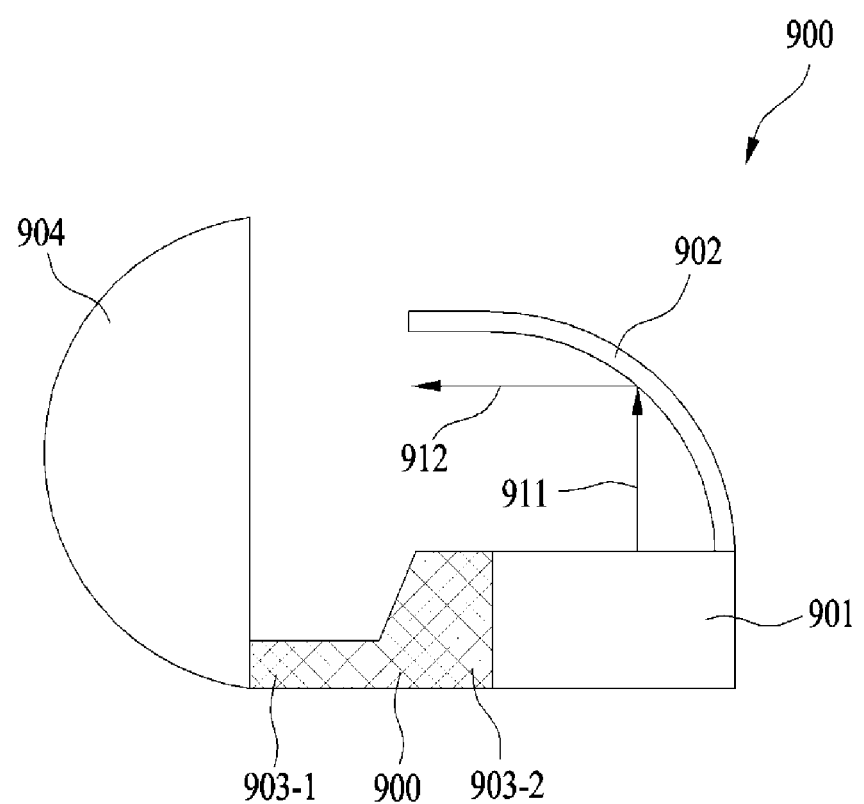
FIG. 19 is a view illustrating a headlamp including the light emitting device package according to any of the embodiments.

FIG. 19 is a view illustrating a head lamp 900 including the light emitting device package according to any of the embodiments. Referring to FIG. 19, the head lamp 900 includes a light emitting module 901, a reflector 902, a shade 903, and a lens 904.

The light emitting module 901 may include a plurality of light emitting device packages (not illustrated) disposed on a board (not illustrated). In this case, the light emitting device packages may be based on any one of the above-described embodiments 100 to 500, 1200*a* to 1200*c*, 1300 and 1400.

The reflector 902 reflects light 911 emitted from the light emitting module 901 in a given direction, for example, in a front direction 912.

The shade 903 is located between the reflector 902 and the lens 904 and serves to block or reflect part of light reflected by the reflector 902 to thereby be directed to the lens 904, thereby assisting a designer in configuring a desired light distribution pattern. One side portion 903-1 and the other side portion 903-2 of the shade 903 may have different heights.

Light emitted from the light emitting module 901 is reflected by the reflector 902 and the shade 903 and, thereafter, passes through the lens 904 to thereby be directed forward of a vehicle. The lens 904 may forwardly refract light reflected by the reflector 902.

As is apparent from the above description, the embodiments may prevent insulation defects of a light emitting device due to thermal stress, may prevent contact defects caused when an adhesive member is damaged by thermal stress, may prevent deterioration in the reliability of light emitting chip bonding, and may enhance light extraction efficiency.

Embodiments provide a light emitting device package which is capable of preventing deterioration in the reliability of light emitting chip bonding and enhancing light extraction efficiency.

In one embodiment, a light emitting device package includes a first lead frame including a first contact area and a first exposed area, a second lead frame spaced apart from the first lead frame, the second lead frame including a second contact area and a second exposed area, a bottom portion located between the first contact area and the first exposed area, between the second contact area and the second exposed area, and between the first contact area and the second contact area, a light emitting device electrically connected to the first and second contact areas, and a package body having a cavity configured to expose the first and second contact areas, the first and second exposed areas, and the bottom portion, wherein the bottom portion has a thermal expansion coefficient greater than a thermal expansion coefficient of the first and second lead frames.

The bottom portion, exposed through the cavity of the package body, may have a surface area smaller than the sum of surfaces areas of the first and second contact areas and surface areas of the first and second exposed areas.

The bottom portion may electrically isolate the first and second lead frames from each other.

The light emitting device may include a first electrode and a second electrode, and the first electrode may be bonded to the first contact area, and the second electrode may be bonded to the second contact area.

The thermal expansion coefficient of the bottom portion may be equal to or smaller than a thermal expansion coefficient of the package body.

The first lead frame may have a first groove located between the first contact area and the first exposed area, and the second lead frame may have a second groove located between the second contact area and the second exposed area, and the bottom portion may have a portion located in the first and second grooves.

The light emitting device may have an edge vertically aligned with a first boundary line, and the first boundary line may include a boundary line between the bottom portion and the first exposed area and a boundary line between the bottom portion and the second exposed area.

The light emitting device may have an edge vertically aligned with at least a portion of the bottom portion.

The light emitting device package may further include a reflective member located on the first and second contact areas and the first and second exposed areas.

The ratio of the surface area of the bottom portion exposed through the cavity of the package body to the sum of the surfaces areas of the first and second contact areas and the surface areas of the first and second exposed areas may be within a range from 1:1.5 to 1:2.5.

In accordance with another embodiment, a light emitting device package including a first lead frame including a first contact area and a first exposed area, a second lead frame spaced apart from the first lead frame, the second lead frame including a second contact area and a second exposed area, a bottom portion including a first attenuation portion located between the first contact area and the first exposed area, a second attenuation portion located between the second contact area and the second exposed area, and a third attenuation portion located between the first contact area and the second contact area, a light emitting device electrically connected to the first and second contact areas, and a package body having a cavity configured to expose the first and second contact areas, the first and second exposed areas, and the bottom portion, wherein the bottom portion has a surface area smaller than the sum of surfaces areas of the first and second contact areas and surface areas of the first and second exposed areas, and the bottom portion has a thermal expansion coefficient greater than a thermal expansion coefficient of the first and second lead frames.

The bottom portion may have a reflectance greater than a reflectance of the first and second contact areas and the first and second exposed areas.

The bottom portion may further include a fourth attenuation portion located between the first lead frame and the second contact area, and a fifth attenuation portion located between the second lead frame and the first contact area.

The bottom portion may further include a sixth attenuation portion located between the first exposed area and the second exposed area.

The first lead frame may have a first groove located between the first contact area and the first exposed area, and the second lead frame may have a second groove located between the second contact area and the second exposed area, and the first attenuation portion may be located in the first groove, and the second attenuation portion may be located in the second groove.

The first groove may have a lower surface spaced apart from a lower surface of the first lead frame, and the second groove may have a lower surface spaced apart from a lower surface of the second lead frame.

The third to sixth attenuation portions may electrically isolate the first lead frame and the second lead frame from each other.

In accordance with another embodiment, a light emitting device package including a package body having a cavity, a first lead frame and a second lead frame provided at a bottom surface of the cavity, a light emitting device electrically connected to the first lead frame and the second lead frame respectively, and a reflective layer disposed on the bottom surface of the cavity, the reflective layer including titanium oxide, wherein the reflective includes a base material and the titanium oxide, and the base material of the reflective layer may be the same material as the package body.

The bottom surface of the cavity may include a first region corresponding to the light emitting device and a second region around the first region, and the reflective layer may be disposed in at least one of the first region or the second region.

The light emitting device may be connected to the first lead frame and the second lead frame via a conductive adhesive or at least one wire.

In the above description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a first lead frame including a first contact area and a first exposed area;
   a second lead frame electrically isolated from the first lead frame, the second lead frame including a second contact area and a second exposed area;
   a bottom portion that electrically isolates the first and second lead frames from each other;
   a light emitting device electrically connected to the first and second contact areas; and
   a package body having a cavity configured to expose the first and second contact areas, the first and second exposed areas, and the bottom portion,
   wherein one end of the first lead frame is formed to have a first convex portion and a first concave portion, one end of the second lead frame is formed to have a second convex portion that faces the first concave portion and a second concave portion that faces the first convex portion, and one side of the first convex portion is configured to face one side of the second convex portion,
   wherein the first contact area is provided within the first convex portion, and the second contact area is provided within the second convex portion,
   wherein the first lead frame has a first groove located between the first contact area and the first exposed area, and the second lead frame has a second groove located between the second contact area and the second exposed area,
   wherein the bottom portion is provided between the first convex portion and the second concave portion, between the first contact area and the second contact area, and between the second convex portion and the first concave portion, and is provided in the first and second grooves, and
   wherein the bottom portion has a thermal expansion coefficient greater than a thermal expansion coefficient of the first and second lead frames.

2. The package according to claim 1, wherein the bottom portion, exposed through the cavity of the package body, has a surface area smaller than the sum of surfaces areas of the first and second contact areas and surface areas of the first and second exposed areas.

3. The package according to claim 1, wherein the light emitting device includes a first electrode and a second electrode, and
   wherein the first electrode is bonded to the first contact area, and the second electrode is bonded to the second contact area.

4. The package according to claim 1, wherein the thermal expansion coefficient of the bottom portion is equal to or smaller than a thermal expansion coefficient of the package body.

5. The package according to claim 1, wherein the light emitting device has an edge vertically aligned with a first boundary line, and the first boundary line includes a boundary line between the bottom portion and the first exposed area and a boundary line between the bottom portion and the second exposed area.

6. The package according to claim 1, wherein the light emitting device has an edge vertically aligned with at least a portion of the bottom portion.

7. The package according to claim 1, further comprising a reflective member located on the first and second contact areas and the first and second exposed areas.

8. The package according to claim 2, wherein a ratio of the surface area of the bottom portion exposed through the cavity of the package body to the sum of the surfaces areas of the first and second contact areas and the surface areas of the first and second exposed areas is within a range from 1:1.5 to 1:2.5.

9. The package according to claim 1, wherein portions between a first space and a second space and between the second space and a third space have a bent shape, and the first space is a space between the first convex portion and the second concave portion, and the second space is a space between one side of the first convex portion and one side of the second convex portion, and the third space is a space between one end of the second convex portion and the first concave portion.

10. A light emitting device package comprising:
a first lead frame including a first contact area and a first exposed area;
a second lead frame spaced apart from the first lead frame, the second lead frame including a second contact area and a second exposed area;
a bottom portion that electrically isolates the first and second lead frames from each other;
a light emitting device electrically connected to the first and second contact areas; and
a package body having a cavity configured to expose the first and second contact areas, the first and second exposed areas, and the bottom portion,
wherein one end of the first lead frame is formed to have a first convex portion and a first concave portion, one end of the second lead frame is formed to have a second convex portion that faces the first concave portion and a second concave portion that faces the first convex portion, and one side of the first convex portion is configured to face one side of the second convex portion,
wherein the first contact area is provided within the first convex portion, and the second contact area is provided within the second convex portion,
wherein the first lead frame has a first groove located between the first contact area and the first exposed area, and the second lead frame has a second groove located between the second contact area and the second exposed area,
wherein the bottom portion includes:
a first attenuation portion provided in the first groove;
a second attenuation portion provided in the second groove;
a third attenuation portion located between the first contact area and the second contact area;
a fourth attenuation portion located between the first concave portion and the second contact area; and
a fifth attenuation portion located between the first contact area and the second concave portion, and
wherein the bottom portion has a thermal expansion coefficient greater than a thermal expansion coefficient of the first and second lead frames.

11. The package according to claim 10, wherein the bottom portion has a reflectance greater than a reflectance of the first and second contact as and the first and second exposed areas.

12. The package according to claim 10, wherein the bottom portion further includes a sixth attenuation portion, located between the first exposed and the second exposed area.

13. The package according to claim 10, wherein the first groove has a lower surface spaced apart from a lower surface of the first lead frame, and the second groove has a lower surface spaced apart from a lower surface of the second lead frame.

14. The package according to claim 12, wherein the third to sixth attenuation portions electrically isolate the first lead frame and the second lead frame from each other.

15. The package according to claim 10, wherein the bottom portion has a surface area smaller than the sum of surfaces areas of the first and second contact areas and surface areas of the first and second exposed areas.

* * * * *